(12) United States Patent
Fukumoto

(10) Patent No.: US 10,644,224 B2
(45) Date of Patent: May 5, 2020

(54) METHOD OF MANUFACTURING A KEYBOARD

(71) Applicant: Microsoft Technology Licensing, LLC, Redmond, WA (US)

(72) Inventor: Masaaki Fukumoto, Beijing (CN)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 198 days.

(21) Appl. No.: 15/365,942

(22) Filed: Nov. 30, 2016

(65) Prior Publication Data

US 2017/0084408 A1   Mar. 23, 2017

Related U.S. Application Data

(63) Continuation of application No. 14/074,403, filed on Nov. 7, 2013, now Pat. No. 9,514,902.

(51) Int. Cl.
*H01L 41/22* (2013.01)
*H01L 41/047* (2006.01)
(Continued)

(52) U.S. Cl.
CPC ............ *H01L 41/22* (2013.01); *H01H 13/14* (2013.01); *H01H 13/704* (2013.01);
(Continued)

(58) Field of Classification Search
CPC ....... H01L 41/047; H01L 41/09; H01L 41/22; G06F 3/0202; G06F 3/041; G06F 3/0414;
(Continued)

(56) References Cited

U.S. PATENT DOCUMENTS 3,591,749 A * 7/1971 Comstock ............ H01H 13/702
116/306
3,940,637 A    2/1976 Ohigashi et al.
(Continued)

FOREIGN PATENT DOCUMENTS

CN     101763192     6/2010
CN     102236463     11/2011
(Continued)

OTHER PUBLICATIONS

Blankenship, Tim, "Tactile feedback solutions using piezoelectric actuators (Part 1 of 2)", retrieved on Jul. 5, 2013 at <<http://www.eetimes.com/document.asp?doc_id=1278418>>, EE Times, Nov. 17, 2010, 5 pages.
(Continued)

*Primary Examiner* — A. Dexter Tugbang
(74) *Attorney, Agent, or Firm* — Faegre Drinker Biddle & Reath LLP

(57) ABSTRACT

Methods of making an electronic device and a keyboard are disclosed. One method including providing a flexible film; providing a first electrode underneath the flexible film, the first electrode coupled to a high voltage signal source; providing a second electrode located beneath the first electrode, the second electrode coupled to an input detector; providing a spacer configured to maintain at least a threshold distance between the first electrode and the second electrode; providing a piezoelectric actuator beneath the second electrode, a top surface of the piezoelectric actuator coupled to the second electrode, wherein contact between the first electrode and the second electrode couples the high voltage signal source to the input detector and the piezoelectric actuator; and providing a base plane beneath the piezoelectric actuator, the base plane coupled to a bottom surface of the piezoelectric actuator and a signal ground.

9 Claims, 17 Drawing Sheets

(51) Int. Cl.

| | | |
|---|---|---|
| *H01H 13/704* | (2006.01) | |
| *H01H 13/85* | (2006.01) | |
| *H03K 17/96* | (2006.01) | |
| *H01H 13/14* | (2006.01) | |
| *H01L 41/09* | (2006.01) | |
| *G06F 3/02* | (2006.01) | |
| *G06F 3/041* | (2006.01) | |
| *H01H 13/703* | (2006.01) | |
| *H01H 13/7057* | (2006.01) | |
| *H01H 13/702* | (2006.01) | |
| *H03K 17/967* | (2006.01) | |
| *H01H 13/705* | (2006.01) | |

(52) U.S. Cl.
CPC .......... *H01H 13/85* (2013.01); *H01L 41/047* (2013.01); *H01L 41/09* (2013.01); *H03K 17/9622* (2013.01); *G06F 3/0202* (2013.01); *G06F 3/041* (2013.01); *G06F 3/0414* (2013.01); *H01H 13/702* (2013.01); *H01H 13/703* (2013.01); *H01H 13/705* (2013.01); *H01H 13/7057* (2013.01); *H01H 2201/02* (2013.01); *H01H 2215/052* (2013.01); *H01H 2223/042* (2013.01); *H01H 2231/002* (2013.01); *H03K 17/964* (2013.01); *H03K 17/967* (2013.01); *H03K 2217/96054* (2013.01); *H03K 2217/96062* (2013.01); *Y10T 29/42* (2015.01)

(58) Field of Classification Search
CPC ..... H03K 17/9622; H03K 2217/96059; H03K 2217/96062; H03K 17/964; H03K 17/967; H03K 2217/96054; Y10T 29/42; H01H 2215/052; H01H 2201/02; H01H 2231/002; H01H 2223/042; H01H 13/14; H01H 13/702; H01H 13/703; H01H 13/704; H01H 13/85; H01H 13/705; H01H 13/7057
See application file for complete search history.

(56) References Cited

U.S. PATENT DOCUMENTS

| | | | |
|---|---|---|---|
| 4,516,112 | A | 5/1985 | Chen |
| 5,231,326 | A | 7/1993 | Echols |
| 5,883,459 | A | 3/1999 | Cline et al. |
| 6,429,846 | B2 | 8/2002 | Rosenberg et al. |
| 7,045,933 | B2 | 5/2006 | Dollgast |
| 7,667,371 | B2 | 2/2010 | Sadler et al. |
| 7,952,261 | B2 | 5/2011 | Lipton et al. |
| 8,339,250 | B2 | 12/2012 | Je et al. |
| 2007/0146348 | A1 | 6/2007 | Villain |
| 2007/0165297 | A1 | 7/2007 | Sandner et al. |
| 2008/0117166 | A1 | 5/2008 | Rosenberg |
| 2008/0251364 | A1 | 10/2008 | Takala et al. |
| 2009/0167704 | A1 | 7/2009 | Terlizzi et al. |
| 2010/0038227 | A1 | 2/2010 | Lu |
| 2010/0052880 | A1 | 3/2010 | Laitinen et al. |
| 2011/0012717 | A1 | 1/2011 | Pance et al. |
| 2011/0148608 | A1 | 6/2011 | Grant et al. |
| 2011/0193787 | A1 | 8/2011 | Morishige et al. |
| 2012/0068957 | A1 | 3/2012 | Puskarich et al. |
| 2012/0105333 | A1* | 5/2012 | Maschmeyer .......... G06F 3/041 345/173 |
| 2012/0106051 | A1* | 5/2012 | Fluhrer ................ H03K 17/964 361/679.01 |
| 2012/0223824 | A1 | 9/2012 | Rothkopf |
| 2013/0002556 | A1 | 1/2013 | Griffin |
| 2013/0207793 | A1* | 8/2013 | Weaber ................ G06F 3/0202 340/407.2 |
| 2014/0152148 | A1 | 6/2014 | Oh et al. |
| 2014/0340208 | A1 | 11/2014 | Tan et al. |
| 2015/0122621 | A1 | 5/2015 | Fukumoto |

FOREIGN PATENT DOCUMENTS

| | | | |
|---|---|---|---|
| CN | 102750030 | 10/2012 | |
| EP | 0525374 A1 | 2/1993 | |
| EP | 1699065 A2 | 9/2006 | |
| EP | 2418705 A1 | 2/2012 | |
| JP | 401130215 | 5/1989 | |
| JP | 2000267785 A * | 9/2000 | .......... H01H 13/702 |
| WO | WO2010085575 A1 | 7/2010 | |

OTHER PUBLICATIONS

Hughes, "Apple's Haptic touch feedback concept uses actuators, senses force on iPhone, iPad", retrieved from <<http://appleinstider.com/articles/12/03/22/apples_haptic_touch_feedback_concept_uses_actuators_senses_force_on_iphone_ipad>>, Mar. 22, 2012, 8 pages.

Kim, "A Masking Study of Key-Click Feedback Signals on a Virtual Keyboard", EuroHaptics'12, In Proceedings of the International Conference on Haptics: perception, devices, mobility, and communication, vol. Part I, Jun. 2012, pp. 247-257.

Levin et al., "Tactile-Feedback Solutions for an Enhanced User Experience", In Information Display, Oct. 2009, 4 pages.

Office action for U.S. Appl. No. 14/074,403, dated Jan. 25, 2016, Fukumoto, "Controller-Less Quick Tactile Feedback Keyboard", 8 pages.

Office action for U.S. Appl. No. 13/894,866, dated Feb. 9, 2016, Tan et al., "Localized Key-Click Feedback", 10 pages.

Office action for U.S. Appl. No. 14/074,403, dated May 25, 2016, Fukumoto, "Controller-Less Quick Tactile Feedback Keyboard", 5 pages.

PCT Search Report & Written Opinion for Application No. PCT/US2014/037940, dated Sep. 4, 2014, 11 pages.

PCT Search Report & Written Opinion for Application No. PCT/US2014/063272, dated Feb. 10, 2015, 10 pages.

"Second Written Opinion Issued in PCT Application No. PCT/US2014/063272", dated Oct. 12, 2015, 7 Pages.

"International Preliminary Report on Patentability Issued in PCT Application No. PCT/US2014/063272", dated Feb. 16, 2016, 8 Pages.

"Second Office Action Issued in Chinese Patent Application No. 201480060700.8", dated Dec. 20, 2017, 10 Pages.

The Chinese Office Action dated Apr. 5, 2017 for Chinese Patent Application No. 201480060700.8, a counterpart foreign application of U.S. Pat. No. 9,514,902.

"Office action Issued in European Patent Application No. 14796376.3", dated Apr. 11, 2019, 7 Pages.

\* cited by examiner

METHOD OF MANUFACTURING A KEYBOARD

This Application claims is a divisional of and claims priority to U.S. patent application Ser. No. 14/074,403 filed Nov. 7, 2013, which is incorporated by reference herein.

BACKGROUND

Keyboards are important and popular input mechanisms for providing input to a variety of computing devices. Notwithstanding the development of various alternative human input technologies, such as touchscreens, voice recognition, and gesture recognition, keyboards and keypads remain the most commonly used device for human input to computing devices. Most trained typists who are able to type at moderate to high speeds (i.e., about 50 words per minute or higher) tend to be reliant on haptic feedback (i.e., touch or tactile feedback), which indicates to the typist that a key has been depressed. Keyboards with mechanically movable keys (referred to herein as "mechanical keyboards") have generally met this need by providing some form of naturally occurring haptic feedback for a user who actuates these spring-loaded, movable keys of the keyboard. For example, one popular mechanism used for providing haptic feedback in traditional mechanical keyboards is a "buckling spring" mechanism underneath each key that buckles under sufficient pressure from a user's finger when the user actuates a key. The buckling of the spring causes a snapping action that provides a tactile sensation to the user to indicate that the key has been actuated.

As computing devices have become smaller and more portable with advances in computer technology, the traditional mechanical keyboard has become less common, especially for computing devices with relatively small form factors. This is because the technology used in mechanical keyboards may provide a design constraint on the maximum thinness of the keyboard. Manufacturers concerned with the portability of their devices have addressed this problem by developing alternative keyboard technologies that do not utilize mechanically movable keys. As a consequence, these keyboards with so called "non-actuating" keys may be made thinner and sleeker (~3 millimeters thick) than even the thinnest mechanical keyboards. For example, pressure sensitive keyboards do not require mechanically movable keys or parts. Thus, the main constraint on the thickness of a pressure sensitive keyboard is the material used for the component layers of the keyboard providing structure and sensing functions. These alternative keyboard technologies have enabled more portable computing devices and keyboards.

However, thinner keyboards with non-actuating keys (i.e., keys that generally do not mechanically actuate) fail to provide tactile feedback. Typists who use such keyboards can only feel their finger on the surface of the key, but cannot feel any movement of the key. Without haptic feedback, trained typists become unsure about whether a keystroke has registered, and they are forced to resort to visual feedback by checking finger placement, which slows down the typing speed.

SUMMARY

Described herein are techniques for providing quick haptic feedback, without the use of a controller that is local to individual, non-actuating keys, such as keys of a thin keyboard or keypad. The haptic feedback may be in the form of a simulated "key-click" feedback for an individual key that is pressed by a user such that the finger used to press the key feels the tactile sensation. The haptic feedback mimics the tactile sensation of a mechanical key (e.g., buckling spring, pop-dome key switch, etc.) to give a user the perception that they have actuated a mechanically movable key.

This Summary is provided to introduce a selection of concepts in a simplified form that is further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The same reference numbers in different figures indicates similar or identical items.

DETAILED DESCRIPTION

Embodiments of the present disclosure are directed to, among other things, techniques and systems for providing quick haptic feedback without the use of a controller that is local to individual, non-actuating keys of a physical keyboard or keypad. As used herein, the term "keyboard" may include any type of keyboard, keypad, or input device suitable for including non-actuating keys. Embodiments disclosed herein find particular application to keyboards integrated with, or used as a peripheral device to, slate or tablet computers, notebooks or laptop computers, and the like. In particular, the embodiments disclosed herein benefit portable computing devices by providing a relatively thin keyboard with improved portability that is also functional for a touch typist. However, it is to be appreciated that the disclosed embodiments may also be utilized for other applications, including remote control input devices for television or similar devices, gaming system controllers, mobile phones, automotive user input mechanisms, home automation (e.g., keyboards embedded in furniture, walls, etc.), and the like.

The techniques and systems disclosed herein utilize a piezoelectric actuator (piezo actuator) as part of an actuator switch in a keyboard with non-actuating keys. The piezo actuator deforms and alters shape in response to electrical current, which causes a tactile perception. Although a piezo actuator is described herein, any other type of actuator may be used that generates a suitable physical response to an electrical current for providing haptic feedback. A variety of natural and synthetic materials exhibit the piezoelectric effect. Suitable materials for piezo actuators include, but are not limited to, ceramic materials, crystal materials, and the like.

Multiple actuator switches may be positioned in a layout that substantially corresponds to a layout of non-actuating keys of a keyboard. In some illustrative examples, the mechanical force produced by each actuator switch can be isolated and local to each non-actuating key of the keyboard. The haptic feedback can create a localized, tactile key-click sensation on a user's finger that presses upon an individual non-actuating key.

The techniques and systems described herein may be implemented in a number of ways. Example implementations are provided below with reference to the following figures.

Example Actuator Switch

Figure 1:
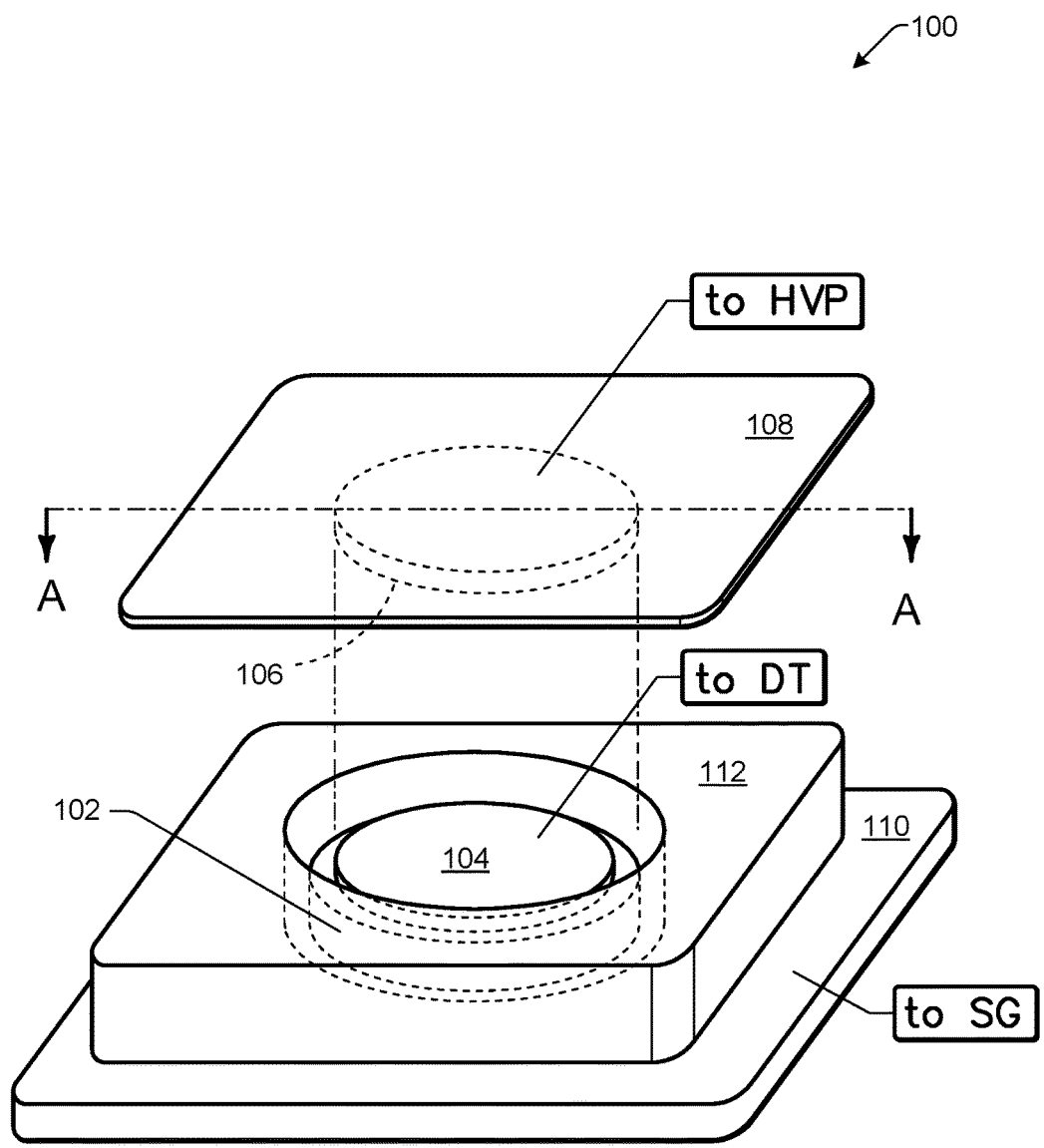
FIG. 1 illustrates an exploded, perspective view of an example actuator switch including a piezo actuator for localized haptic feedback.

FIG. 1 illustrates an exploded, perspective view of an example actuator switch 100 including a piezo actuator 102 for localized haptic feedback. A piezo electrode 104 is on the top surface of the piezo actuator 102 and a film electrode 106 is on a bottom surface of a flexible film 108. The bottom surface of the piezo actuator 102 is on a top surface of a conductive base plane 110, which may be made of copper or any other suitable conductive material. The film electrode 106 is connected to a high voltage signal source (HVP). The base plane 110 is connected to signal ground (SG). The piezo electrode 104 is connected to a high impedance input detector (DT). Electrically conductive adhesive may be used to couple the piezo actuator 102 to the base plane 110. However, any suitable means of attaching the piezo actuator 102 to the base plane 110 may be utilized, such as a latch or similar feature that fits over a side of the piezo actuator 102 to hold it in place.

A spacer 112 between the flexible film 108 and the base plane 110 provides for a at least a threshold distance or gap (e.g., at least a minimum distance) to be maintained between the film electrode 106 and the piezo electrode 104 when there is no touch pressure or less than a threshold amount (e.g., less than a maximum amount) of touch pressure exerted on the flexible film 108 above the film electrode 106. The film electrode 106 is located above the piezo electrode 104. The spacer 112 has a hole to allow the film electrode 106 to contact the piezo electrode 104 in response to touch pressure on the flexible film 108 above the film electrode 106.

In some illustrative examples, the spacer 112 is configured to insulate the flexible film 108 from the base plane 110. This spacer 112 can help to prevent shorting an associated circuit, and can also provide structure to the actuator switch 100 by filling space in areas between the flexible film 108 and the base plane 110. The spacer 112 may be any suitable electrically insulating material, such as plastic, polymer material like polyethylene, glass, and the like.

Furthermore, FIG. 1 shows the piezo actuator 102 as being disc-shaped, but any suitable shape may be utilized. For example, the piezo actuator 102 may be square, rectangular, or some other suitable shape, and may be of variable cross-section thickness or otherwise non-uniform in shape. The piezo actuator 102 can also be multi-layered.

Figure 2A:
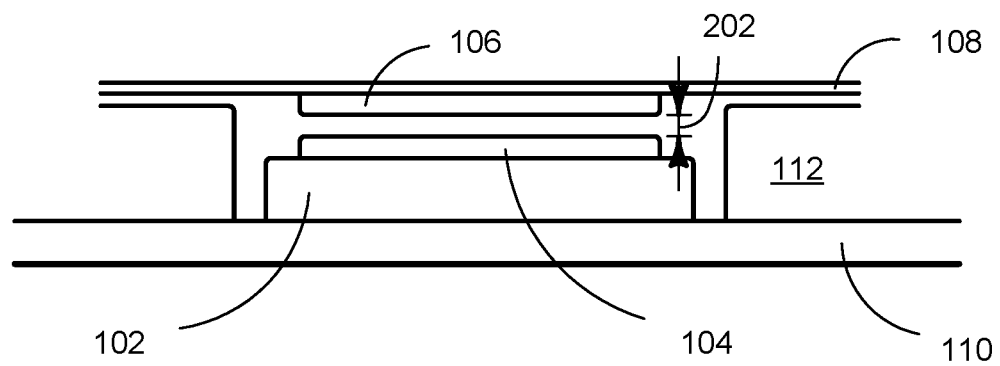
FIG. 2A illustrates a partial side, cross-sectional view of the actuator switch along section line A-A of FIG. 1, including a flexible film configured to flex in response to touch pressure.

FIG. 2A illustrates a partial side, cross-sectional view of the actuator switch 100 along section line A-A of FIG. 1, including the flexible film 108 configured to flex in response to touch pressure. In the illustrated example, the spacer 112 provides for a at least a threshold distance or gap 202 to be maintained between the film electrode 106 and the piezo electrode 104 when there is no touch pressure exerted on the flexible film 108 above the film electrode 106. For example, the gap 202 can be at least a sufficient distance that prevents film electrode 106 from contacting or creating an electrical connection with the piezo electrode 104. The threshold distance can be the minimum distance necessary to prevent film electrode 106 from contacting or creating an electrical connection with the piezo electrode 104. Thus, the spacer 112 ensures that the gap 202 is sufficiently large to prevent any electrical coupling between the film electrode 106 and the piezo electrode 104 in the absence of pressure exerted on the flexible film 108 or when less than a threshold amount (e.g., less than a maximum amount) of pressure is exerted on the flexible film 108.

Figure 2B:
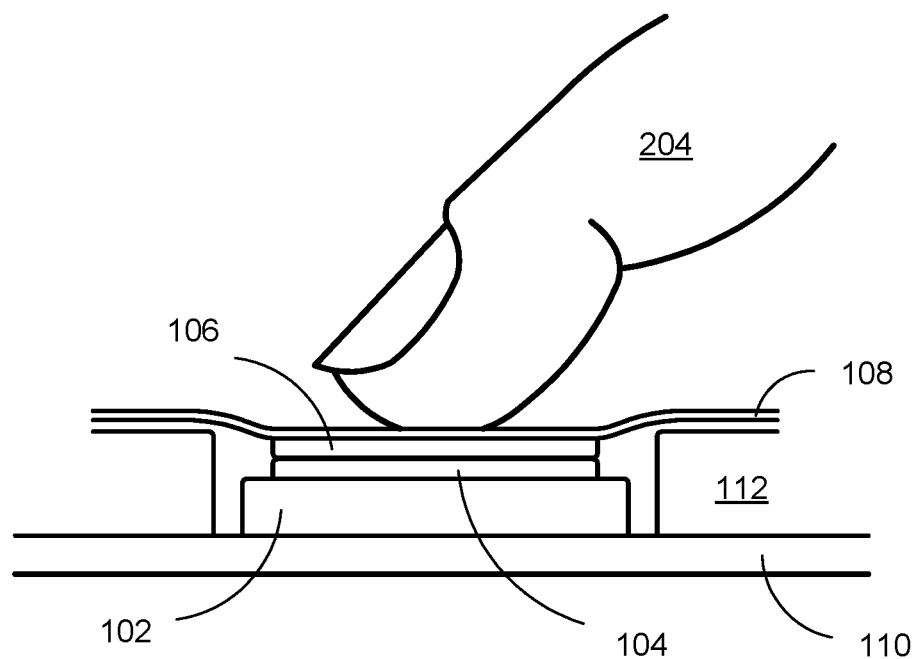
FIG. 2B illustrates a partial side, cross-sectional view of the actuator switch along section line A-A of FIG. 1 after touch pressure is applied to the flexible film causing the film electrode to contact the upper side piezo electrode.

FIG. 2B illustrates a partial side, cross-sectional view of the actuator switch along section line A-A of FIG. 1 after touch pressure is applied to the flexible film 108 causing the film electrode 106 to contact the piezo electrode 104. In the illustrated example, a finger 204 exerts at least a threshold amount of pressure onto the flexible film 108 above the film electrode 106. The threshold amount of pressure can be the minimum amount of pressure that is sufficient to cause the film electrode 106 to contact the piezo electrode 104 through flexing of the flexible film 108. In response to the film electrode 106 contacting the piezo electrode 104, the voltage on piezo electrode 104 can rise (e.g., become "high voltage"), causing a key push to be detected by the high impedance input detector. Also in response to the film electrode 106 contacting the piezo electrode 104, the high voltage is applied to the piezo actuator 102, causing the piezo actuator 102 to deform instantly or approximately instantly. The deforming of the piezo actuator 102 can generate haptic and tactile feedback to the finger 204.

Since the key push can be detected at the same or approximately same time as the deformation of the piezo actuator 102, there is little or no delay from the detection of the key push to the generation of tactile feedback. Thus, no controller circuit is needed for selecting an actuator and applying a signal. In some illustrative examples, surge absorbing devices are added to the input line of the high impedance input detector, such as a varistor or transient voltage suppressor (TVS), in order to prevent damage to the input detector (e.g., in the event of excessive voltage spikes, such as voltage spikes caused by deformation of piezo materials, power surges, etc.).

Example Computing Device

Figure 3:
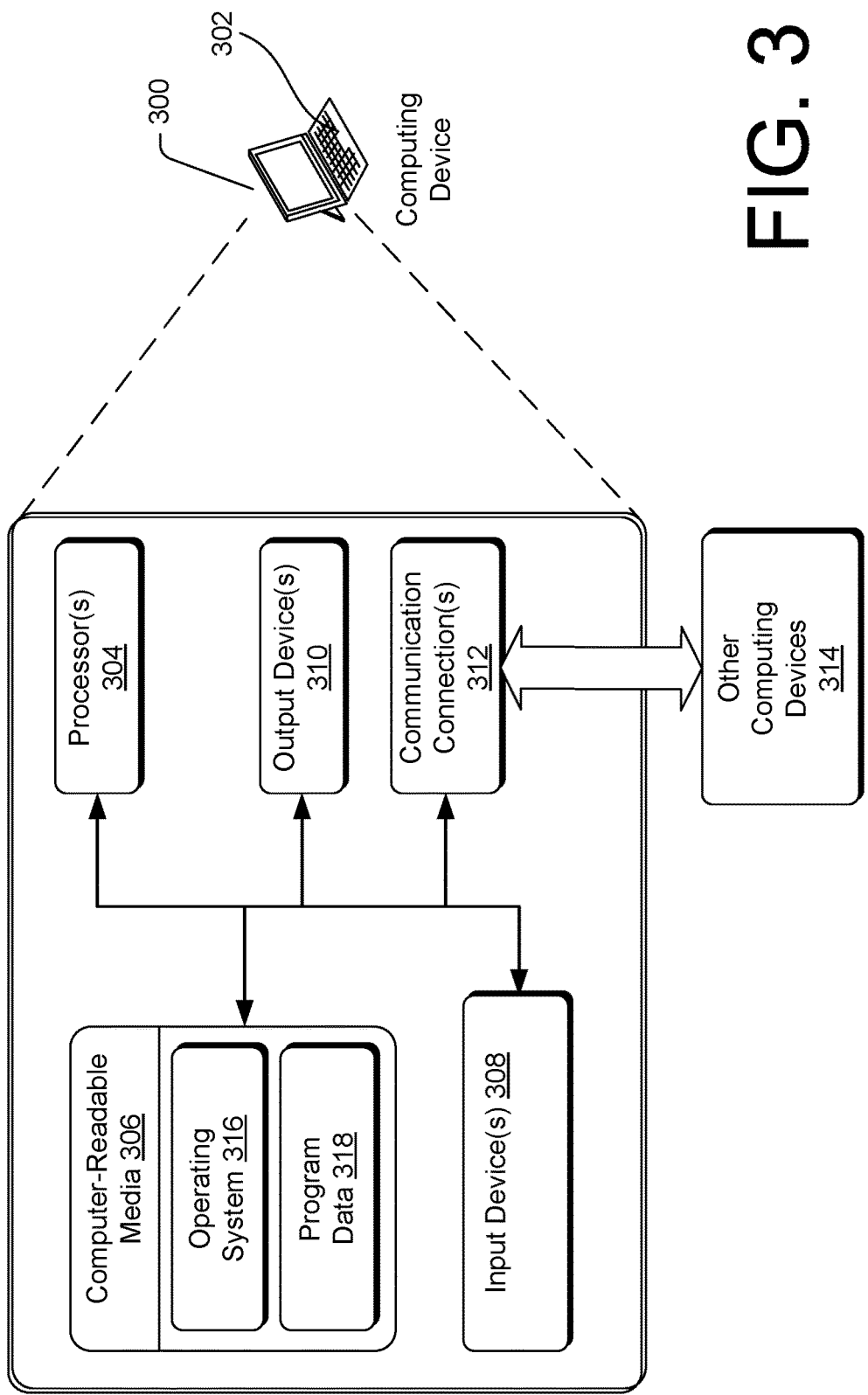
FIG. 3 illustrates an exemplary computing device implementing the actuator switch.

FIG. 3 illustrates an exemplary computing device implementing the actuator switch 100 of FIG. 1. The representative computing device 300 may include one or more keyboards 302. The keyboard 302 may include one or more of the actuator switches 100. In some illustrative examples, the keyboard 302 may be peripheral to, or integrated within, any type of computing device where touch-based typing input may be utilized. For example, the keyboard may be physically connected to such a computing device through electrical couplings such as wires, pins, connectors, etc., or the keyboard may be wirelessly connected to the computing device, such as via short-wave radio frequency (e.g., Bluetooth®), or another suitable wireless communication protocol. Thus, the computing device 300 shown in FIG. 3 is only one illustrative example of a computing device and is not intended to suggest any limitation as to the scope of use or functionality of the computing device. Neither should the computing device 300 be interpreted as having any dependency nor requirement relating to any one or combination of components illustrated in FIG. 3.

In at least one configuration, the computing device 300 comprises one or more processors 304 and computer-readable media 306. The computing device 300 may include one or more input devices 308, such as the keyboard 302. The input device 308 may include the actuator switch of any of the embodiments disclosed herein, such as the actuator switch 100 of FIG. 1, the actuator switch 700 of FIG. 7, the actuator switch 1100 of FIG. 11, or the actuator switch 1400 of FIG. 14. The input devices 308 may also include, in addition to the keyboard 302, a mouse, a pen, a voice input device, a touch input device, etc.

The computing device 300 may include one or more output devices 310 such as a display, speakers, printer, etc. coupled communicatively to the processor(s) 304 and the computer-readable media 306. The computing device 300 may also contain communications connection(s) 312 that allow the computing device 300 to communicate with other computing devices 314 such as via a network.

The computer-readable media 306 of the computing device 300 may store an operating system 316, and may include program data 318. The program data 318 may include processing software that is configured to process signals received at the input devices 308, such as detection of a key-press event on the keyboard 302.

In some implementations, the processor 304 is a microprocessing unit (MPU), a central processing unit (CPU), or other processing unit or component known in the art. Among other capabilities, the processor 304 can be configured to fetch and execute computer-readable processor-accessible instructions stored in the computer-readable media 306 or other computer-readable storage media. Communication connections 312 allow the device to communicate with other computing devices, such as over a network. These networks can include wired networks as well as wireless networks.

The one or more processors 304 may include a central processing unit (CPU), a graphics processing unit (GPU), a microprocessor, a digital signal processor, and so on. The computer-readable media 306 may be configured to store one or more software and/or firmware modules, which are executable on the one or more processors 304 to implement various functions. The term "module" is intended to represent example divisions of the software for purposes of discussion, and is not intended to represent any type of requirement or required method, manner or organization. Accordingly, while various "modules" are discussed, their functionality and/or similar functionality could be arranged differently (e.g., combined into a fewer number of modules, broken into a larger number of modules, etc.).

Alternatively, or in addition, the functionally described herein can be performed, at least in part, by one or more hardware logic components. For example, and without limitation, illustrative types of hardware logic components that can be used include field-programmable gate arrays (FPGAs), application-specific integrated circuits (ASICs), application-specific standard products (ASSPs), system-on-a-chip systems (SOCs), complex programmable logic devices (CPLDs), etc.

computer-readable media 306 includes tangible and/or physical forms of media included in a device and/or hardware component that is part of a device or external to a device, including but not limited to random-access memory (RAM), static random-access memory (SRAM), dynamic random-access memory (DRAM), read-only memory (ROM), erasable programmable read-only memory (EPROM), electrically erasable programmable read-only memory (EEPROM), phase change memory (PRAM), flash memory, compact disc read-only memory (CD-ROM), digital versatile disks (DVDs), optical cards or other optical storage media, magnetic cassettes, magnetic tape, magnetic disk storage, magnetic cards or other magnetic storage devices or media, solid-state memory devices, storage arrays, network attached storage, storage area networks, hosted computer storage or any other storage memory, storage device, and/or storage medium that can be used to store and maintain information for access by a computing device.

Although the computer-readable media 306 is depicted in FIG. 3 as a single unit, the computer-readable media 306

(and all other memory described herein) may include computer storage media or a combination of computer storage media and other computer-readable media. Computer-readable media 306 may include computer storage media and/or communication media. Computer storage media includes volatile and non-volatile, removable and non-removable media implemented in any method or technology for storage of information such as computer-readable instructions, data structures, program modules, or other data. Computer storage media includes, but is not limited to, phase change memory (PRAM), static random-access memory (SRAM), dynamic random-access memory (DRAM), other types of random-access memory (RAM), read-only memory (ROM), electrically erasable programmable read-only memory (EEPROM), flash memory or other memory technology, compact disk read-only memory (CD-ROM), digital versatile disks (DVD) or other optical storage, magnetic cassettes, magnetic tape, magnetic disk storage or other magnetic storage devices, or any other non-transmission medium that can be used to store information for access by a computing device.

In contrast, communication media may embody computer-readable instructions, data structures, program modules, or other data in a modulated data signal, such as a carrier wave, or other transmission mechanism. As defined herein, computer storage media does not include communication media.

Example Input Detection for a Keyboard

Figure 4:
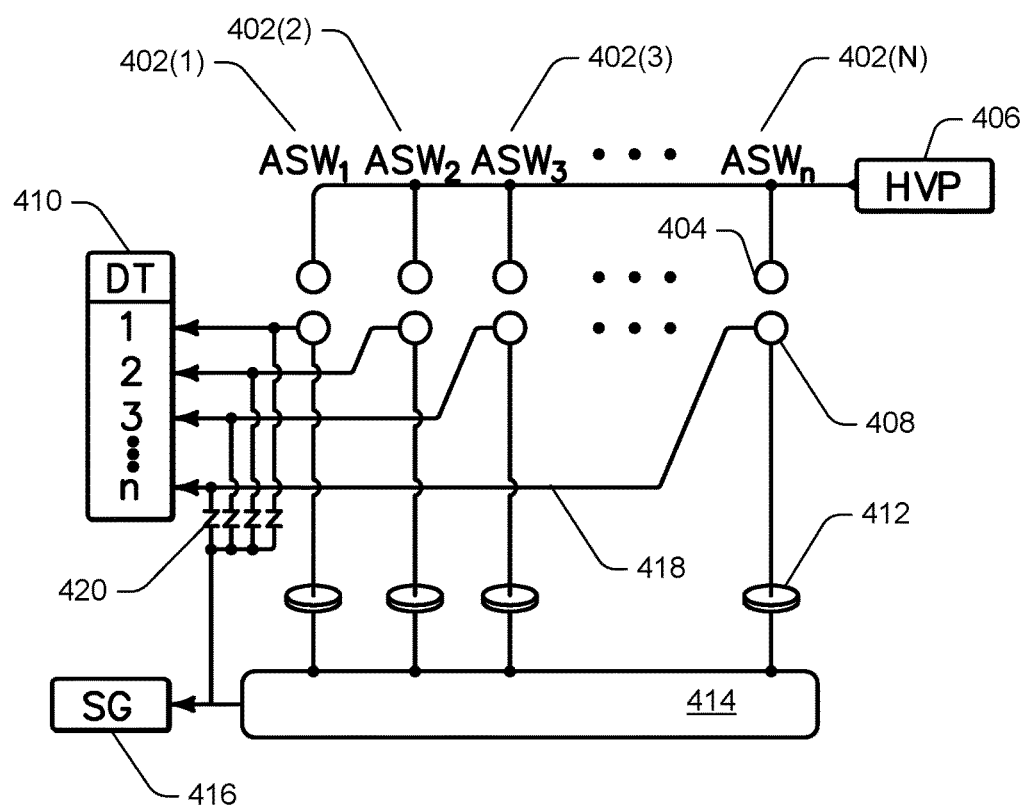
FIG. 4 illustrates a block diagram for input detection for actuator switches of a keyboard.

FIG. 4 illustrates a block diagram for input detection for actuator switches of a keyboard 302. In the illustrated example, the keyboard 302 includes a plurality of actuator switches 402(1), 402(2), 402(3) . . . 402(N). Each actuator switch 402 represents an example implementation for the actuator switch 100 of FIG. 1. As an example, the actuator switch 402(N) can have a corresponding film electrode 404, as illustrated, and can be connected to a high voltage signal source 406. A respective piezo electrode 408 opposite of the film electrodes 404 may be connected to a corresponding piezo actuator 412, which may be connected to a base plane 414, such as the base plane 110 of FIG. 1. The base plane 414 may be connected to a signal ground 416. One or more of the piezo electrodes 408 may also be connected to a high impedance input detector 410 via a respective input line 418 to the input detector 410. Surge protection can be improved by adding a surge absorbing device 420 (e.g., varistor or TVS) to the one or more input lines 418 to the input detector 410. In the illustrated example, each of the plurality of actuator switches 402(1), 402(2), 402(3) . . . 402(N) can include a corresponding film electrode 404, piezo electrode 408, piezo actuator 412, input line 418, and surge absorbing device 420 in an arrangement as discussed above for the actuator switch 402(N).

Figure 5:
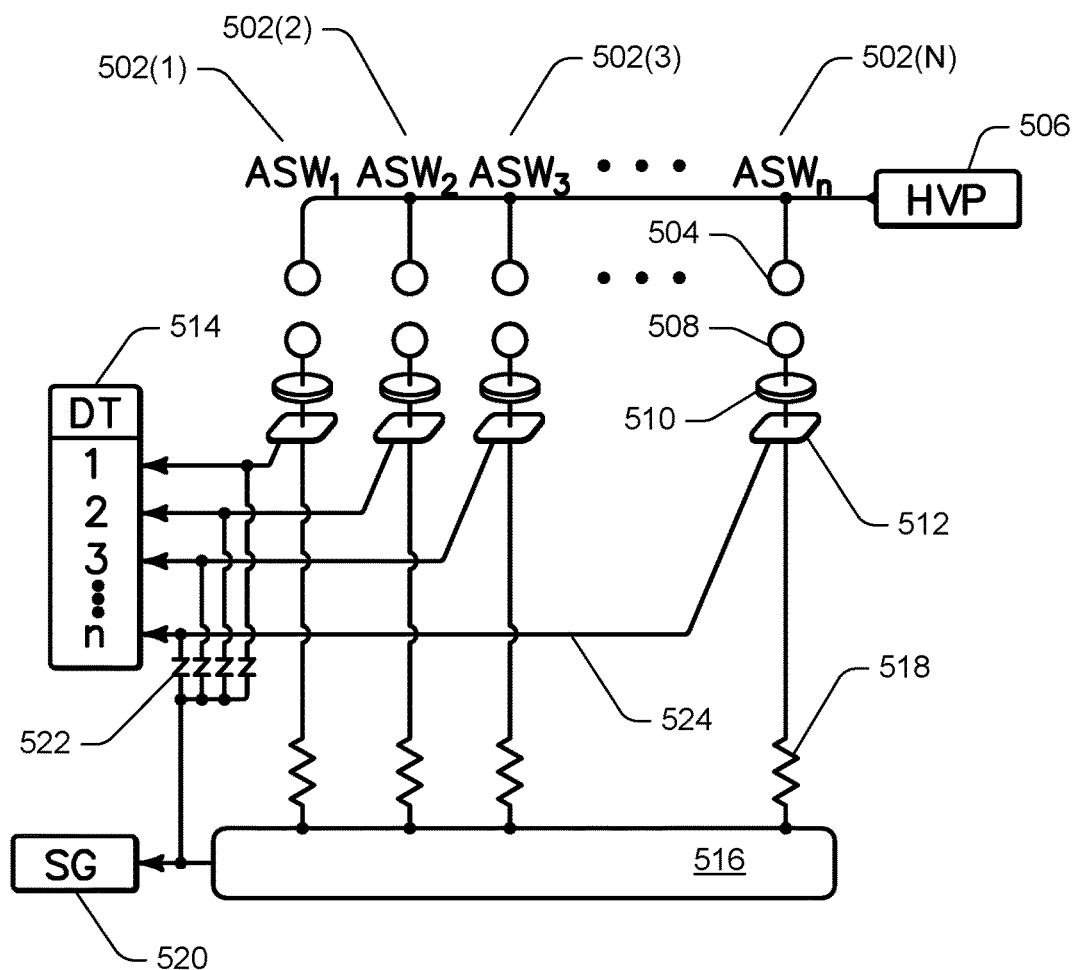
FIG. 5 illustrates a block diagram for input detection for actuator switches of a keyboard.

FIG. 5 illustrates a block diagram for input detection for actuator switches of a keyboard 302. In the illustrated example, the keyboard 302 includes a plurality of actuator switches 502(1), 502(2), 502(3) . . . 502(N). Each actuator switch 502 represents an example implementation for the actuator switch 100 of FIG. 1. As an example, the actuator switch 502(N), can have a corresponding film electrode 504, as illustrated, and can be connected to a high voltage signal source 506. A respective piezo electrode 508 opposite of the film electrodes 504 may be connected to a corresponding piezo actuator 510. Each of the respective piezo actuators 510 may be connected to a corresponding base plane 512. The respective base planes 512 may be connected to a corresponding high impedance input detector 514 by a corresponding input line 524. Each of the respective base planes 512 may also be connected to a common base plane 516 via a corresponding resistor 518. Thus, the base plane for each actuator switch may be separately connected to the common base plane 516. The common base plane 516 may be connected to a signal ground 520. The value of the resistors 518 may be selected to ensure a logical "high" level for the input detector 514 when the high voltage signal source 506 is applied to the piezo electrodes 508. The illustrated example may allow for more efficient and inexpensive manufacturing because input impedance of the input detector 514 can be reduced and no wiring to the piezo electrode 508 is needed. Surge protection can be improved by adding a surge absorbing device 522 (e.g., varistor or TVS) to each of the input lines 524 of the input detector 514. In the illustrated example, each of the plurality of actuator switches 502(1), 502(2), 502(3) . . . 502(N) can include a corresponding film electrode 504, piezo electrode 508, piezo actuator 510, base plane 512, resistor 518, surge absorbing device 522, and input line 524 in an arrangement as discussed above for the actuator switch 502(N).

Example Timing Sequences of Actuator Switches

Figure 6:
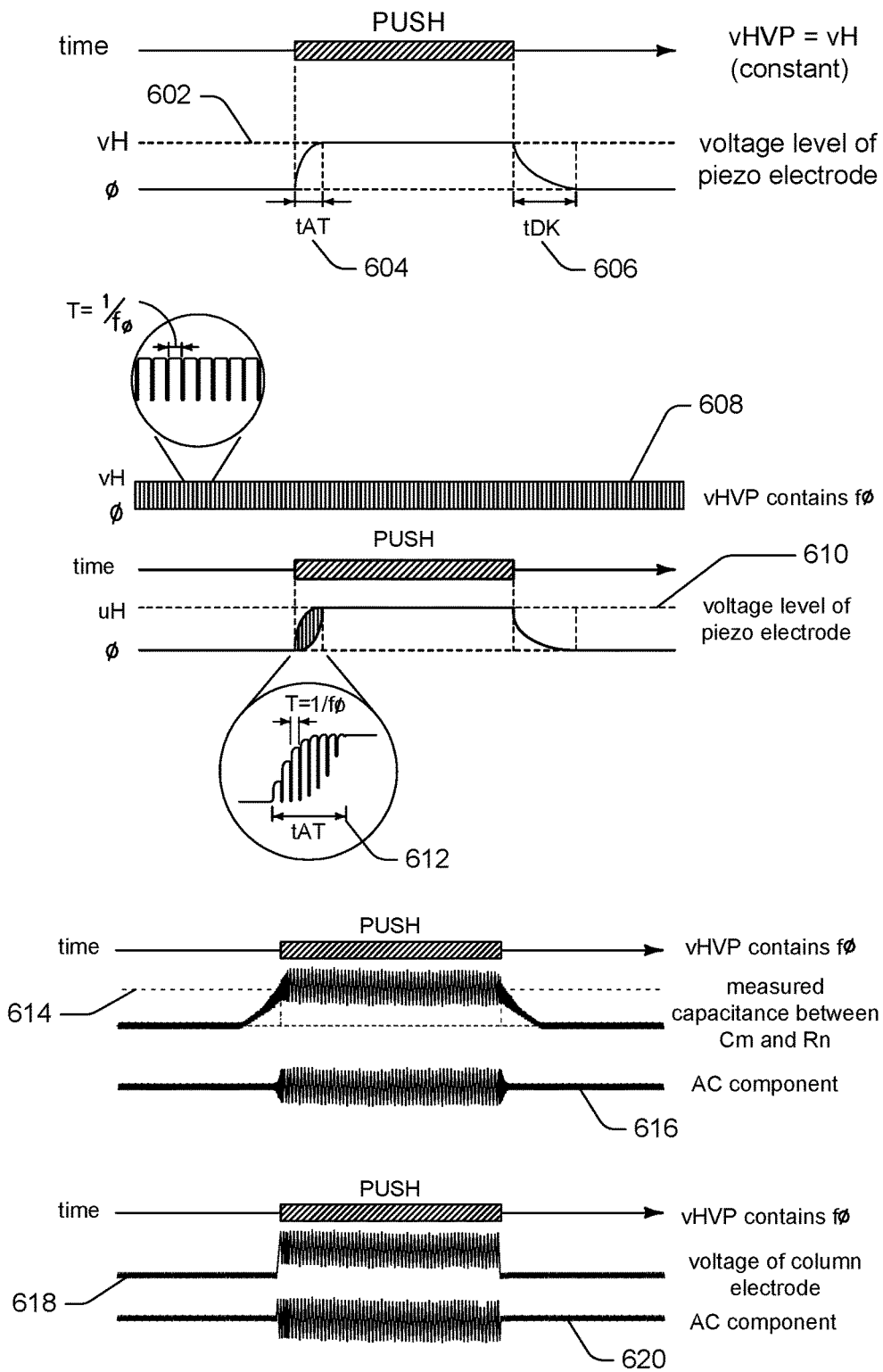
FIG. 6 illustrates timing sequences for various actuator switches.

FIG. 6 illustrates timing sequences for various actuator switches. A voltage signal 602 shows the voltage signal on the piezo electrode 104 of FIG. 1 during various points in time. In the illustrative example, the voltage of the high voltage signal source (HVP) is constantly set to "vH," which can be any voltage level suitable for use as a high voltage signal level. When a key is not pressed (e.g., no touch pressure is applied to the flexible film 108 above the piezo electrode 104), the voltage on the piezo electrode may be zero or approximately zero. When at least a threshold of touch pressure is applied to the flexible film 108 above the piezo electrode 104 that is sufficient to cause film electrode 106 to contact the piezo electrode 104 (e.g., a key is "pressed"), the film electrode 106 may contact the piezo electrode 104, which may cause the voltage signal 602 to quickly reach a value of "vH" within upward settling time of tAT 604 (the upward settling time is represented as "tAT"). The value of tAT 604 may depend on the capacitance of the piezo actuator 102. The value of tAT 604 may be relatively short because of the small capacitance and high impedance of the piezo actuator 102 and the low impedance of the high voltage signal source (HVP).

The instant or approximately instant voltage change may cause a quick deformation of the piezo actuator 102, generating a "click" tactile feedback to the finger 204. When the key is released (e.g., touch pressure is removed from the flexible film 108 above the piezo electrode 104), the film electrode 106 may separate from the piezo electrode 104, so the high voltage signal is no longer applied to the piezo actuator 102. In the illustrative example, the downward settling time tDK 606 (the downward settling time is represented as "tDK") is longer than tAT 604 because the impedance of the piezo actuator 102 and the input detector is relatively high. Since tDK 606 is longer or substantially longer than tAT 604, no clear "click" feeling may be observed due to releasing a key.

In another illustrative example, a voltage signal 610 shows the voltage signal on the piezo electrode 104 of FIG. 1 during various points in time. The voltage signal 608 of the HVP may contain an eigen frequency "f0" of the piezo actuator 102 that can generate a relatively large deformation of the piezo actuator 102. For example, the voltage signal 608 of the HVP can mainly provide a high voltage DC signal of a voltage value "vH," and the voltage signal 608 may have a short dip for each "1/f0" cycle. When a key is pressed (e.g., at least a minimum threshold of touch pressure is applied to the flexible film 108 above the piezo electrode 104), the film electrode 106 may contact the piezo electrode 104, which may cause the voltage signal 610 on the piezo electrode 102 to have a relatively short settling time of tAT 612. During the upward settling time of tAT 612, "f0" components may appear and enhance the deformation of the piezo actuator 102, which can result in relatively larger tactile and haptic feedback. After the upward settling time of tAT 612, the voltage signal 610 may arrive at a value of "vH," which is the voltage of the HVP, and the portion of the voltage signal 610 that is due to the "f0" component of the voltage signal 608 may dissolve, dissipate, or reduce to a smaller or negligible amount. In some examples, at this point, no tactile feedback is provided or observed because of the high impedance of the piezo actuator 102 and HVP's low impedance (and also because of the short duration of each dip of the voltage signal 610). In other examples, a reduced tactile feedback is provided because of the high impedance of the piezo actuator 102, HVP's low impedance, and the short duration of each dip of the voltage signal 610. The measured capacitance 614, the AC component 616 (alternating current component) of the measured capacitance 614, the measured voltage 618 and the AC component 620 of the measured voltage 618 will be discussed in more detail below with respect to FIGS. 11-15.

Example Actuator Switch

Figure 7:
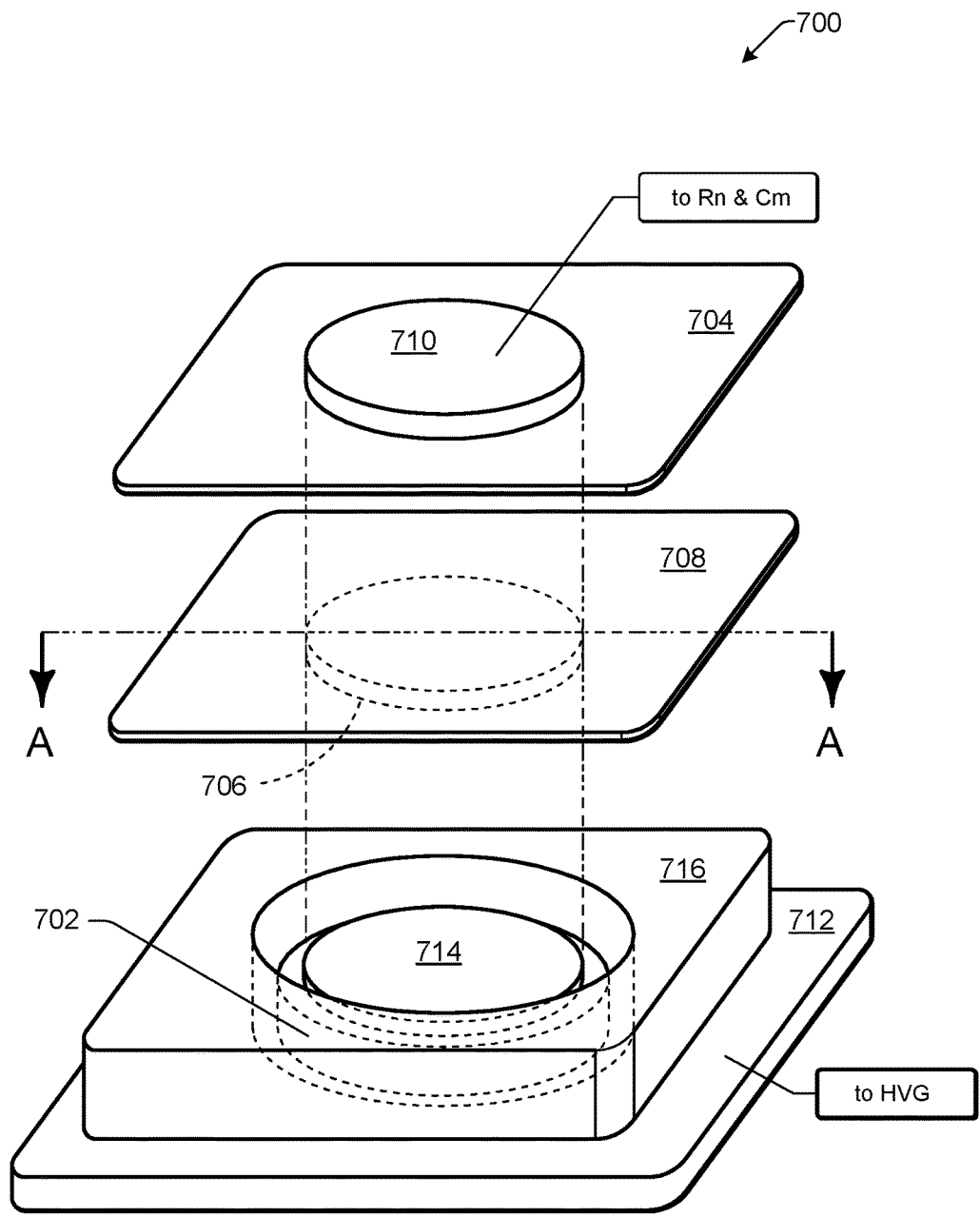
FIG. 7 illustrates an exploded, perspective view of an example actuator switch including a piezo actuator for localized haptic feedback.

FIG. 7 illustrates an exploded, perspective view of an example actuator switch 700 including a piezo actuator 702 for localized haptic feedback. In the illustrative example, an actuator switch, similar to or the same as the actuator switch of FIG. 1 is placed beneath an existing or ordinary keyboard's base film 704. The film electrode 706, located beneath a flexible film 708, may be aligned with a corresponding key top 710 of a keyboard, such as the keyboard 302 (e.g., aligned with the "A" key or "enter" key). In the illustrative example, the key top 706 is a type of force sensing resistor. However, any other suitable type of switching-based mechanism may be used, such as a membrane, dome-switch, or capacitive switch. In the illustrative example, the film electrode 706 is connected to a high voltage signal source (HVP) and a base plane 712 is connected to HVP's ground (HVG). A piezo electrode 714 is aligned with the film electrode 706 and is on a top surface of the piezo actuator 702. The key top 706 may also have electrodes that connect to the keyboard 302's original encoder (to Rn and Cm, which are inputs to the encoder). An example encoder is described in more detail below with regard to FIGS. 9 and 10. Furthermore, a spacer 716 is located between the flexible film 708 and the base plane 712, similar to the spacer 112 of the actuator switch 100 of FIG. 1.

Figure 8A:
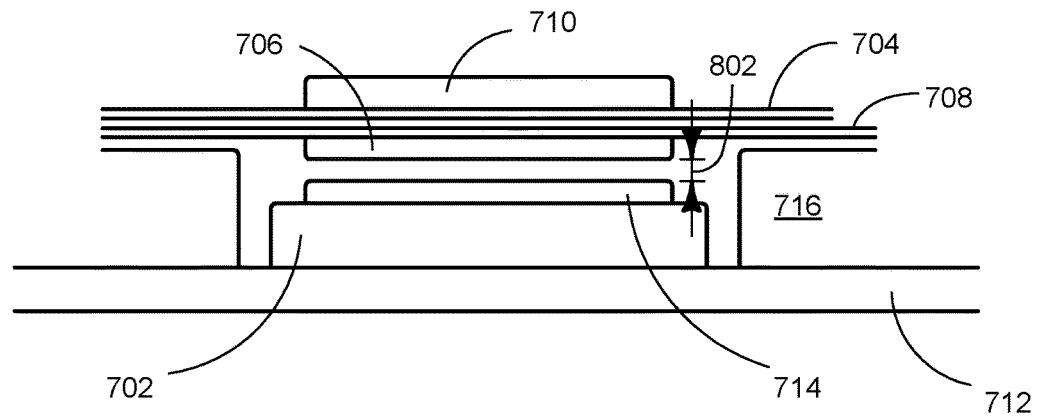
FIG. 8A illustrates a partial side, cross-sectional view of the actuator switch along section line A-A of FIG. 7, including a flexible film configured to flex in response to touch pressure.

FIG. 8A illustrates a partial side, cross-sectional view of the actuator switch 700 along section line A-A of FIG. 7, including the base film 704 and the flexible film 708 configured to flex in response to touch pressure. In the illustrative example, the film electrode 706 is aligned with the key top 710 of the keyboard 302. The spacer 716 maintains a gap 802, similar to the spacer 112 of FIG. 1.

Figure 8B:
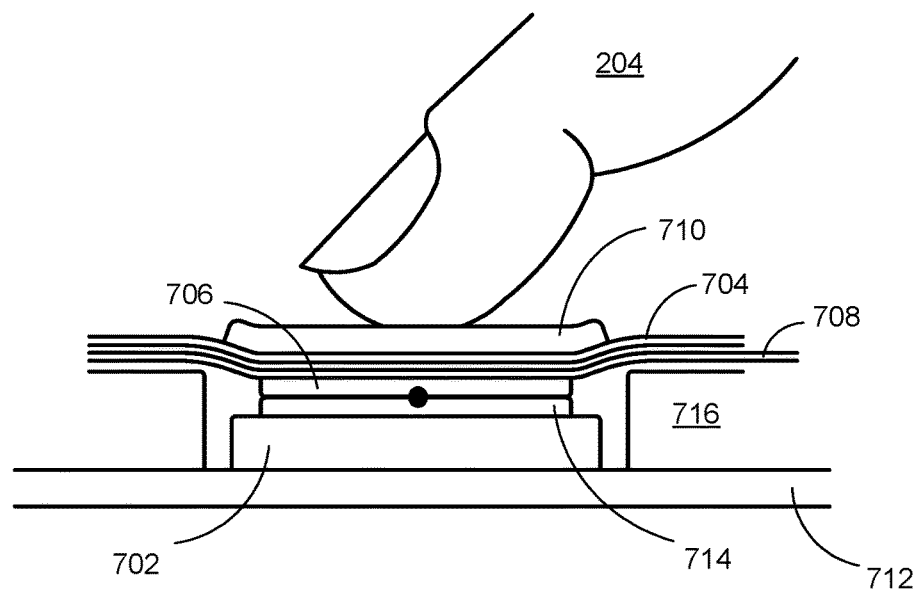
FIG. 8B illustrates a partial side, cross-sectional view of the actuator switch along section line A-A of FIG. 7 after touch pressure is applied to the flexible film causing the film electrode to contact the upper side piezo electrode.

FIG. 8B illustrates a partial side, cross-sectional view of the actuator switch 700 along section line A-A of FIG. 7 after touch pressure is applied to the key top 704 causing the film electrode to contact the upper side piezo electrode. In the illustrative example, at least a minimum threshold amount of touch pressure is applied by the finger 204 to the key top 710, which causes the film electrode 706 to contact the piezo electrode 714. Thus, both the base film 704 and the flexible film 708 may bend to allow the electrodes to contact, which may cause the piezo actuator 702 to generate a "click" tactile feedback to the finger 204. An original encoder of the keyboard 302 may still work for key push detection, so no electrical connection is needed between the original keyboard side and the piezo actuator 702 side. In some illustrative examples, power and ground sources may be combined for circuits from both sides. Moreover, to simplify manufacturing, the base film 704 and the flexible film 708 may be combined as part of a manufacturing and assembly process.

Example Keyboard Encoder

Figure 9:
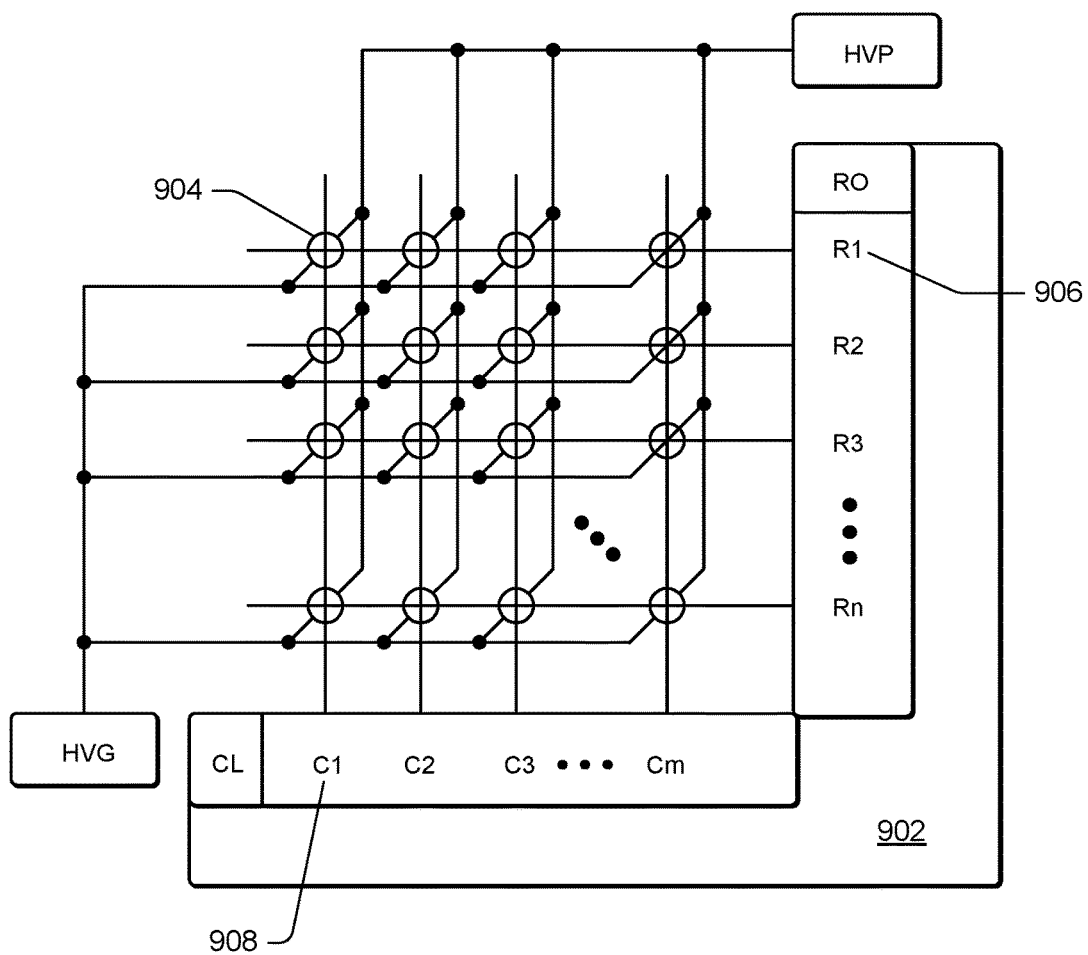
FIG. 9 illustrates a block diagram of a keyboard encoder and actuator switches of the keyboard.

FIG. 9 illustrates a block diagram of a keyboard encoder 902 and actuator switches of a keyboard, such as the keyboard 302 of FIG. 3. The encoder 902 is an example of an encoder, and any other encoder suitable for use with actuator switches may be used. In the illustrated example, an actuator switch 904 has an electrode or other electrical connection that the encoder 902 detects when at least a minimum threshold amount of pressure is applied to a key top of the actuator switch 904 to cause a circuit to close between a row R1 signal input 906 and a column C1 signal input 908 of the encoder 902. The actuator switch may be any suitable switch for use with the keyboard encoder 902, including embodiments described herein, such as the actuator switch 100 of FIG. 1, the actuator switch 700 of FIG. 7, the actuator switch 1100 of FIG. 11, or the actuator switch 1400 of FIG. 14. Thus, multiple actuator switches may be used and integrated with the keyboard 302 by integrating each actuator switch 904 with the encoder 902 and aligning each actuator switch 904 with a corresponding key top of a keyboard or keypad.

Figure 10A:
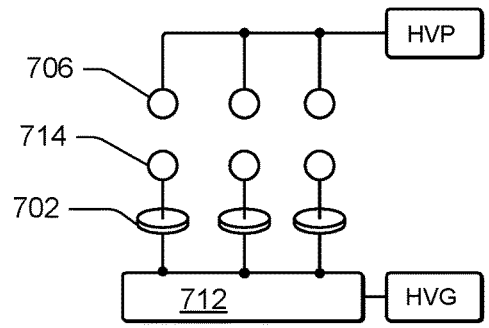
FIG. 10A illustrates a block diagram for input detection for an actuator switch.

FIG. 10A illustrates a block diagram of the actuator switch 700. In the illustrative example, multiple actuator switches are used for the keyboard, such as the keyboard 302, and each switch is connected to a common base plane 712. In the example, the piezo actuator 702, the piezo electrode 714 and the film electrode 706 for an example actuator switch 700 are shown. In some illustrative examples, the same configuration may be implemented for the actuator switch 100.

Figure 10B:
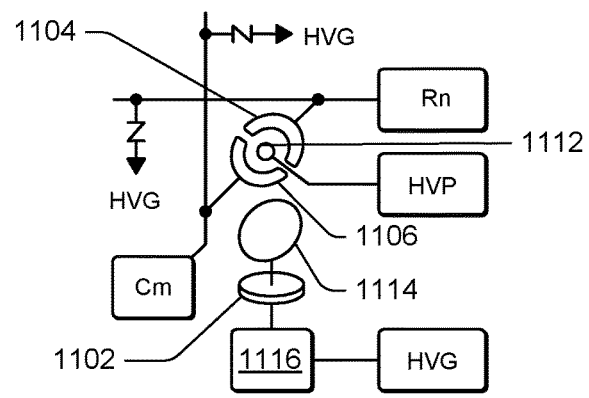
FIG. 10B illustrates a block diagram for input detection for an actuator switch.

The piezo actuator 1102, the row electrode 1104, the column electrode 1106, the film electrode 1112, the piezo electrode 1114 and the base plane 1116 of FIG. 10B will be discussed in more detail below with respect to FIGS. 11-13B. The piezo actuator 1402, the film electrode 1404, the row electrode 1406, the column electrode 1408, the piezo electrode 1412, the encoder electrode 1414 and the base plane 1416 of FIG. 10C will be discussed in more detail below with respect to FIGS. 14-15B.

Example Actuator Switch

Figure 11:
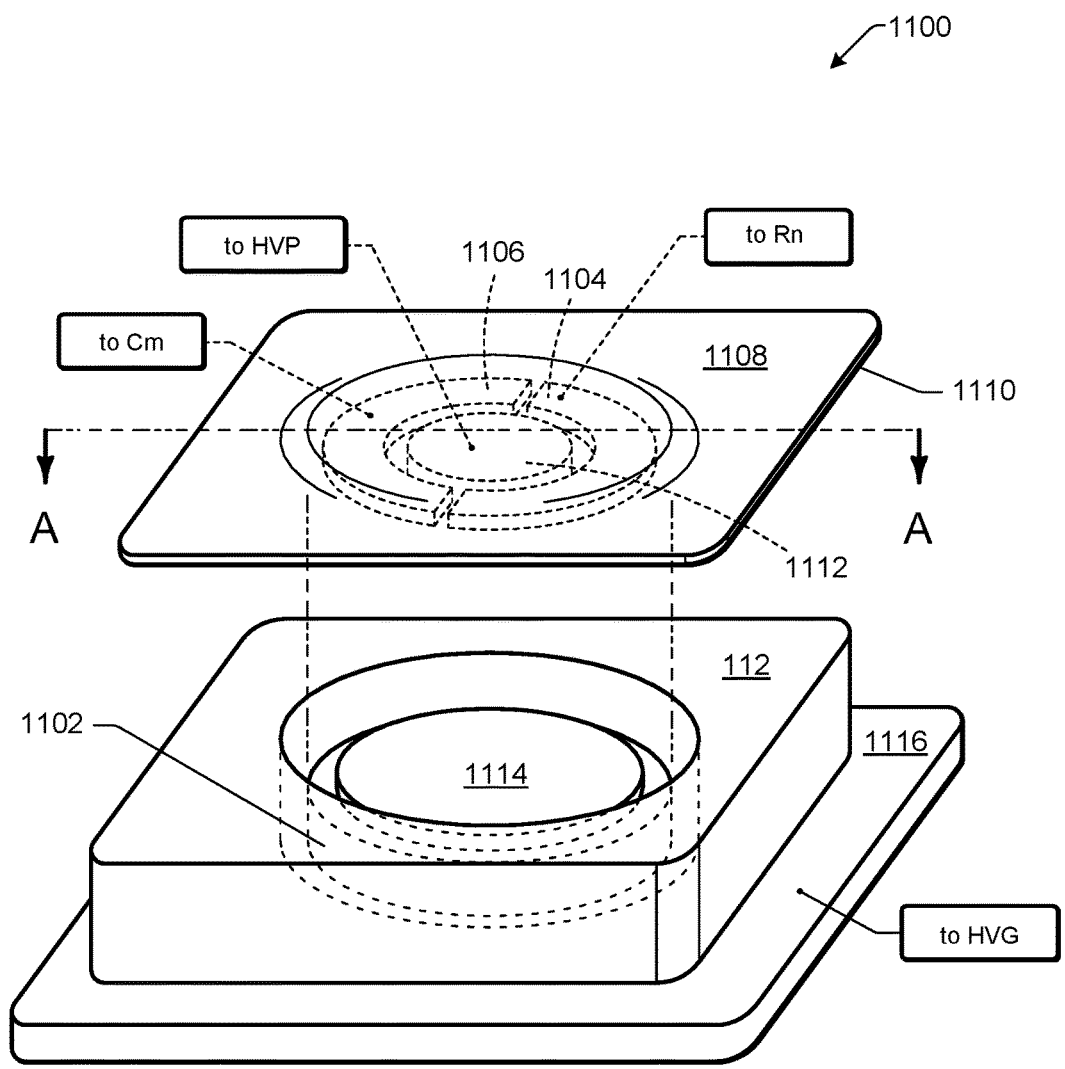
FIG. 11 illustrates an exploded, perspective view of an example actuator switch that uses capacitive switching and includes a piezo actuator for localized haptic feedback.

FIG. 11 illustrates an exploded, perspective view of an example actuator switch 1100, with some aspects similar to the actuator switch 100 of FIG. 1. In the illustrative example, the actuator switch 1100 uses capacitive switching and includes a piezo actuator 1102 for localized haptic feedback. A row electrode 1104 and a column electrode 1106 may be placed between an upper flexible film 1108 and a lower flexible film 1110. The row electrode 1104 and a column electrode 1106 may be insulated from other electrodes. A film electrode 1112 is beneath the upper flexible film 1108 and may be open underneath in order to allow contact with a piezo electrode 1114 when touch pressure is exerted on the upper flexible film 1108 above the film electrode 1112.

In the illustrative example, the film electrode 1112 is connected to a high voltage signal source (HVP) and a base plane 1116 is connected to HVP's ground (HVG). The row electrode 1104 and the column electrode 1106 may be connected to a corresponding position of an encoder, such as the encoder 902, in order for a keyboard to detect a key press. When at least a minimum threshold amount of touch pressure is applied to the upper flexible film 1108 above the film electrode 1112 (e.g., pressing a key pad or area corresponding to a key with sufficient pressure to cause the film electrode 1112 to contact the piezo electrode 1114), the upper flexible film 1108 and the lower flexible film 1110 bend and the film electrode 1112 and the piezo electrode 1114 contact each other. In response to the contact, the piezo actuator 1102 generates a "click" tactile feedback to the finger 204. Furthermore, a spacer 1118 is located between the flexible film 1110 and the base plane 1116, similar to the spacer 112 of FIG. 1.

Figure 12A:
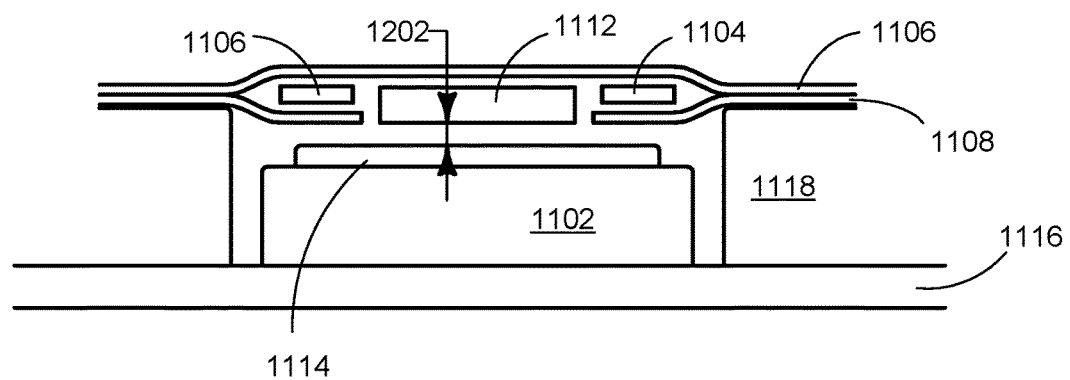
FIG. 12A illustrates a partial side, cross-sectional view of the actuator switch along section line A-A of FIG. 11, including a flexible film configured to flex in response to touch pressure.

FIG. 12A illustrates a partial side, cross-sectional view of the actuator switch 1100 along section line A-A of FIG. 11, including the upper flexible film 1108 and the lower flexible film 1110 configured to flex in response to touch pressure. The spacer 1118 maintains a gap 1202, similar to the spacer 112 of FIG. 1.

Figure 12B:
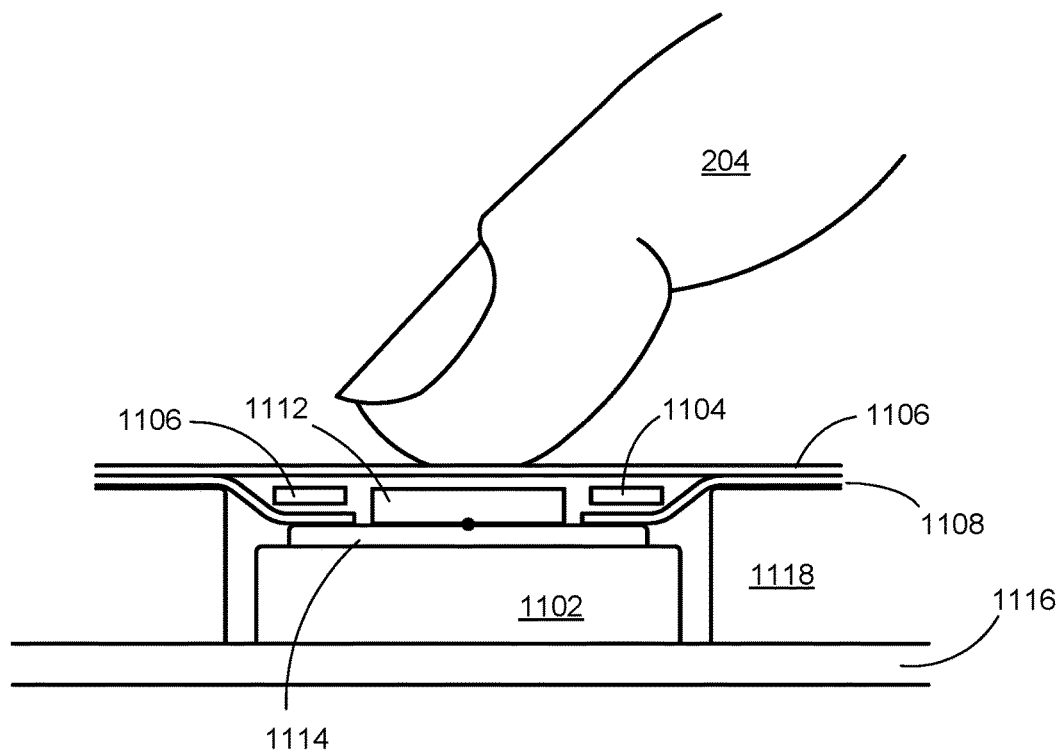
FIG. 12B illustrates a partial side, cross-sectional view of the actuator switch along section line A-A of FIG. 11 after touch pressure is applied to the flexible film causing the film electrode to contact the upper side piezo electrode.

FIG. 12B illustrates a partial side, cross-sectional view of the actuator switch along section line A-A of FIG. 11 after touch pressure is applied to the upper flexible film 1108 and the lower flexible film 1110 causing the film electrode 1112 to contact the piezo electrode 1114.

Example Key Push Detection

Figure 13A:
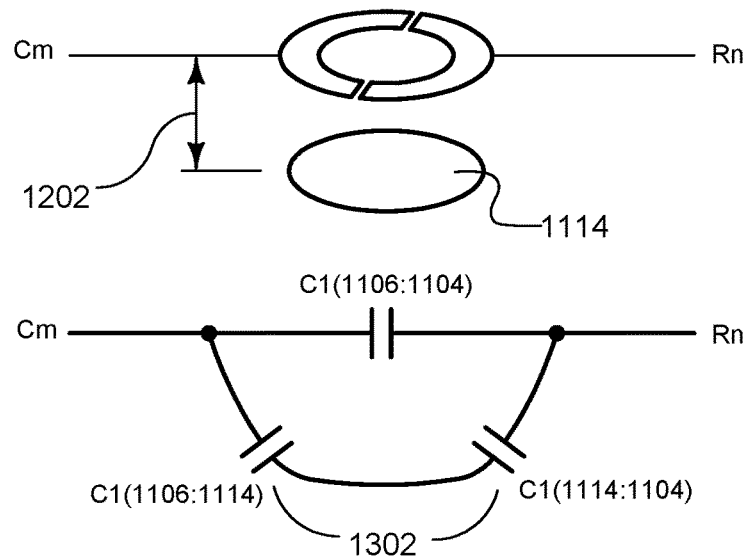
FIG. 13A illustrates a block diagram for capacitive base key push detection.

FIG. 13A illustrates a block diagram for capacitive base key push detection for an actuator switch, such as the actuator switch 1100 of FIG. 11. When pressure is not exerted above the film electrode 1112, such as in FIG. 12A, the row electrode 1104 and the column electrode 1106 may each have a weak capacitive connection 1302 via the piezo electrode 1114 because the piezo electrode 1114 is separated from the row electrode 1104 and the column electrode 1106 by the gap 1202 and thickness of the lower flexible film 1110.

Figure 13B:
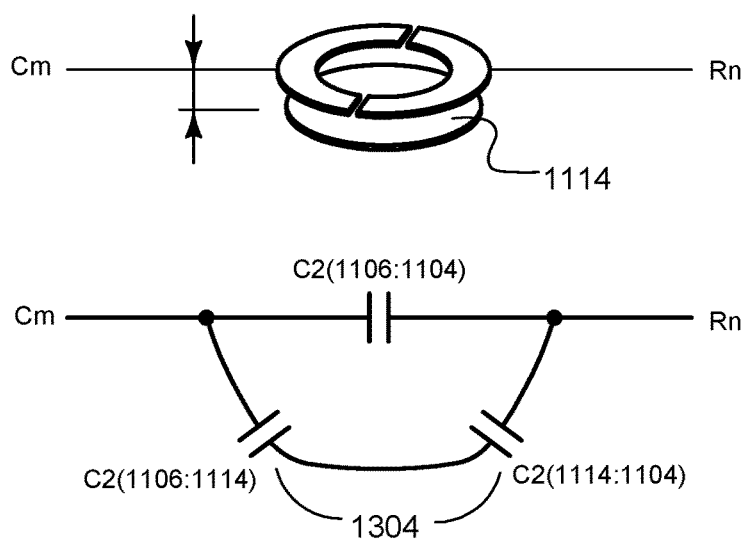
FIG. 13B illustrates a block diagram for capacitive base key push detection.

FIG. 13B illustrates a block diagram for capacitive base key push detection. When at least a minimum threshold amount of touch pressure is exerted above the film electrode 1112, such as in FIG. 12B (e.g., when a key is pressed), the row electrode 1104 and the column electrode 1106 may each have a stronger capacitive connection 1304 via the piezo electrode 1114 because the gap 1202 no longer exists or is a minimal length. Thus, an encoder, such as the encoder 902, may detect the change in capacitance and may generate a key-push action (e.g., detects a key press). FIG. 10B illustrates a block diagram of the actuator switch 1100 that may be used for a keypad or keyboard, such as the keyboard 302.

Measured capacitance 614, as introduced regarding FIG. 6, above, provides an illustrative example of the change in capacitance during key-push and release for the actuator switch 1100. An eigen frequency-based ("f0") actuation signal is used for HVP, so that the measured capacitance 614 is interfered from the signal. The film electrode 1112 and the piezo electrode 1114 may be excited by HVP, and the "f0" component may feed into the measured capacitance 614 between the row electrode 1104 and the column electrode 1106. This interference may become larger when the film electrode 1112 and the piezo electrode 1114 are connected. Therefore, the "f0" component of the measured capacitance 614 can also be used for key-push detection. In some examples, capacitance change due to a key push is slower than the capacitance change due to the eigen frequency "f0," so the "f0" component of the measured capacitance 614 can easily be separated by extracting the AC (or higher frequency) component from the measured capacitance 614. FIG. 6 also illustrates the AC component 616 of the measured capacitance 614.

Example Actuator Switch

Figure 14:
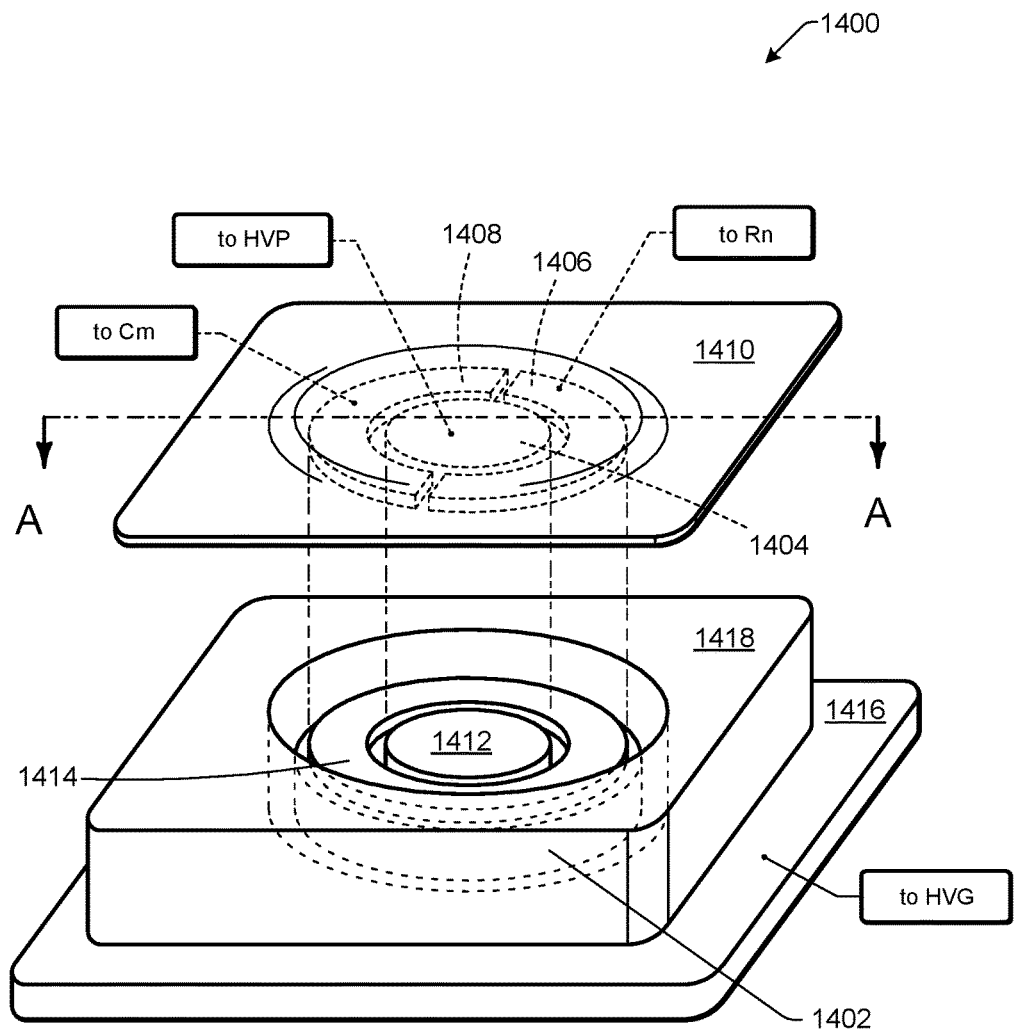
FIG. 14 illustrates an exploded, perspective view of an example actuator switch including a piezo actuator for localized haptic feedback.

FIG. 14 illustrates an exploded, perspective view of an example actuator switch 1400, with some aspects similar to the actuator switch 100 of FIG. 1. The actuator switch 1400 includes a piezo actuator 1402 for localized haptic feedback. The film electrode 1404, the row electrode 1406 and the column electrode 1408 may be placed underneath the flexible film 1410. A piezo electrode 1412 may be located on top of the piezo actuator 1402 and beneath the film electrode 1404 and a ring-shaped encoder electrode 1414 may be located on top of the piezo actuator 1402 and beneath the row electrode 1406 and the column electrode 1408. Thus, the piezo electrode 1412 may be aligned with the film electrode 1404 and the encoder electrode 1414 may be aligned with the row electrode 1406 and the column electrode 1408. In the illustrative example, the film electrode 1404 is connected to a high voltage signal source (HVP) and a base plane 1416 is connected to HVP's ground (HVG). The row electrode 1406 and the column electrode 1408 may be connected to a corresponding signal input of an encoder, such as encoder 902, in order for a keyboard to detect a key press. Furthermore, a spacer 1418 is located between the flexible film 1410 and the base plane 1416, similar to the spacer 112 of FIG. 1.

Figure 10C:
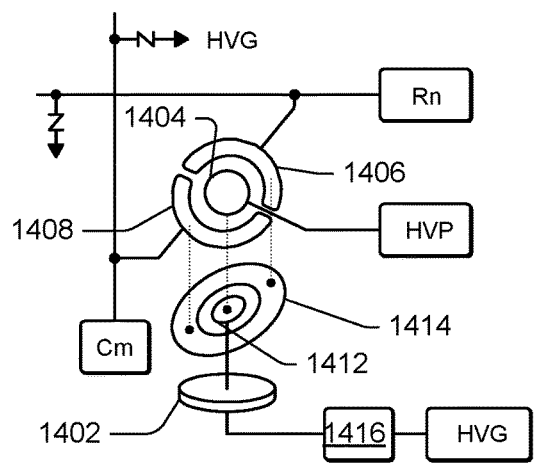
FIG. 10C illustrates a block diagram for input detection for an actuator switch.
Figure 15A:
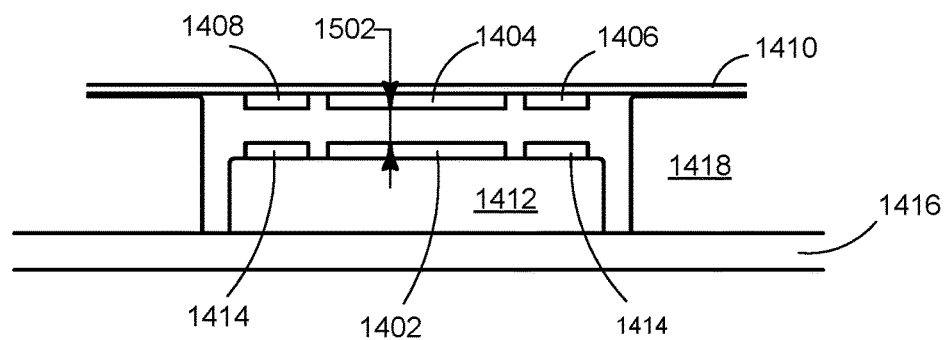
FIG. 15A illustrates a partial side, cross-sectional view of the actuator switch along section line A-A of FIG. 14, including a flexible film configured to flex in response to touch pressure.
Figure 15B:
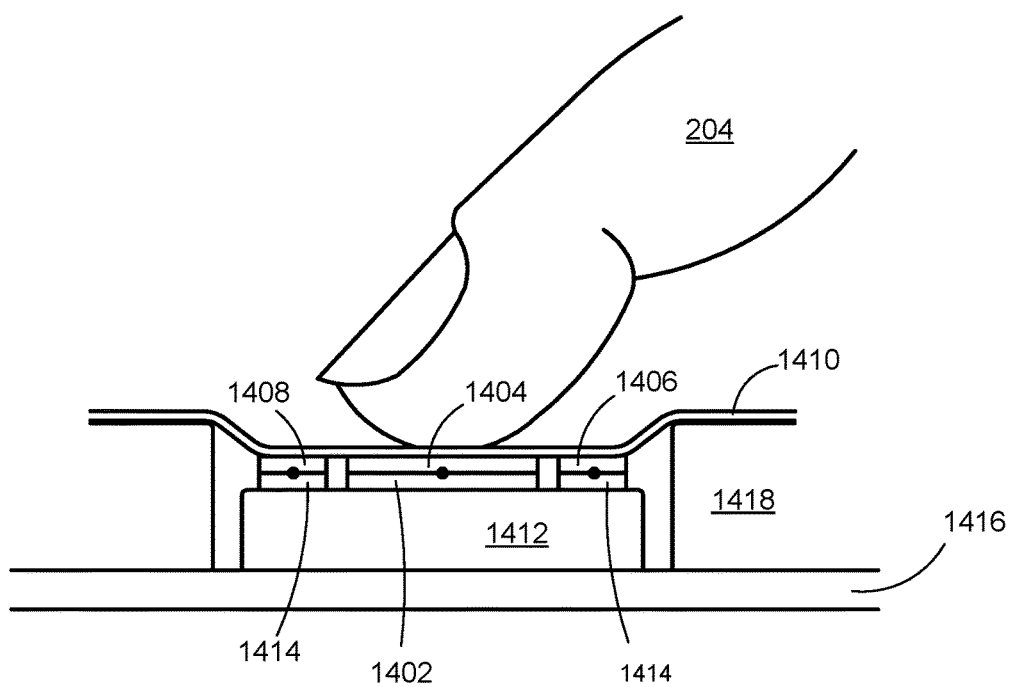
FIG. 15B illustrates a partial side, cross-sectional view of the actuator switch along section line A-A of FIG. 14 after touch pressure is applied to the flexible film.

FIG. 15A illustrates a partial side, cross-sectional view of the actuator switch 1400 along section line A-A of FIG. 14, including a flexible film 1410 configured to flex in response to touch pressure. The spacer 1418 maintains a gap 1502, similar to the spacer 112 of FIG. 1. FIG. 15B illustrates a partial side, cross-sectional view of the actuator switch 1400 along section line A-A of FIG. 14 after touch pressure is applied to the flexible film 1410. When at least a minimum threshold amount of touch pressure is applied to the flexible film 1410 above the film electrode 1404 (e.g., pressing a key pad or area corresponding to a key with sufficient pressure to cause the film electrode 1404 to contact the piezo electrode 1412), the flexible film 1410 bends and the film electrode 1404 and the piezo electrode 1412 may contact each other. In response to the contact, the piezo actuator 1402 may generate a "click" tactile feedback to the finger 204. Also, in response to at least a minimum threshold amount of touch pressure applied to the flexible film 1410 above the film electrode 1404, the row electrode 1406 and the column electrode 1408 may contact the encoder electrode 1414. The contact may cause the row electrode 1406 and the column electrode 1408 to connect to each other via the encoder electrode 1414, which may cause an encoder, such as the encoder 902, to detect a key-push action (e.g., detects a key press). FIG. 10C illustrates a block diagram of the actuator switch 1400 that may be used for a keypad or keyboard, such as the keyboard 302.

Measured voltage 618 as introduced regarding FIG. 6, above, provides an illustrative example of the change in voltage of the column electrode 1408 during key-push and release for the actuator switch 1400. An eigen frequency-based ("f0") actuation signal may be used for HVP, so that the measured voltage 618 of the column electrode 1408 may be interfered from the signal. The film electrode 1404 and the piezo electrode 1412 may be excited by HVP, and the "f0" component feeds into the measured voltage 618 via stray capacitance between the film electrode 1404 and the column electrode 1408, between the film electrode 1404 and the row electrode 1406, and between the piezo electrode 1412 and the encoder electrode 1414. This interference may become larger when the film electrode 1404 and the piezo electrode 1412 are connected. Therefore, the "f0" component of the measured voltage 618 can also be used for key-push detection. In some examples, voltage change due to a key push is slower than the voltage change due to the eigen frequency "f0," so the "f0" component of the measured voltage 618 can easily be separated by extracting the AC (or higher frequency) component from the measured voltage 618. FIG. 6 also illustrates the AC component 620 of the measured voltage 618.

Example Keyboard

Figure 16:
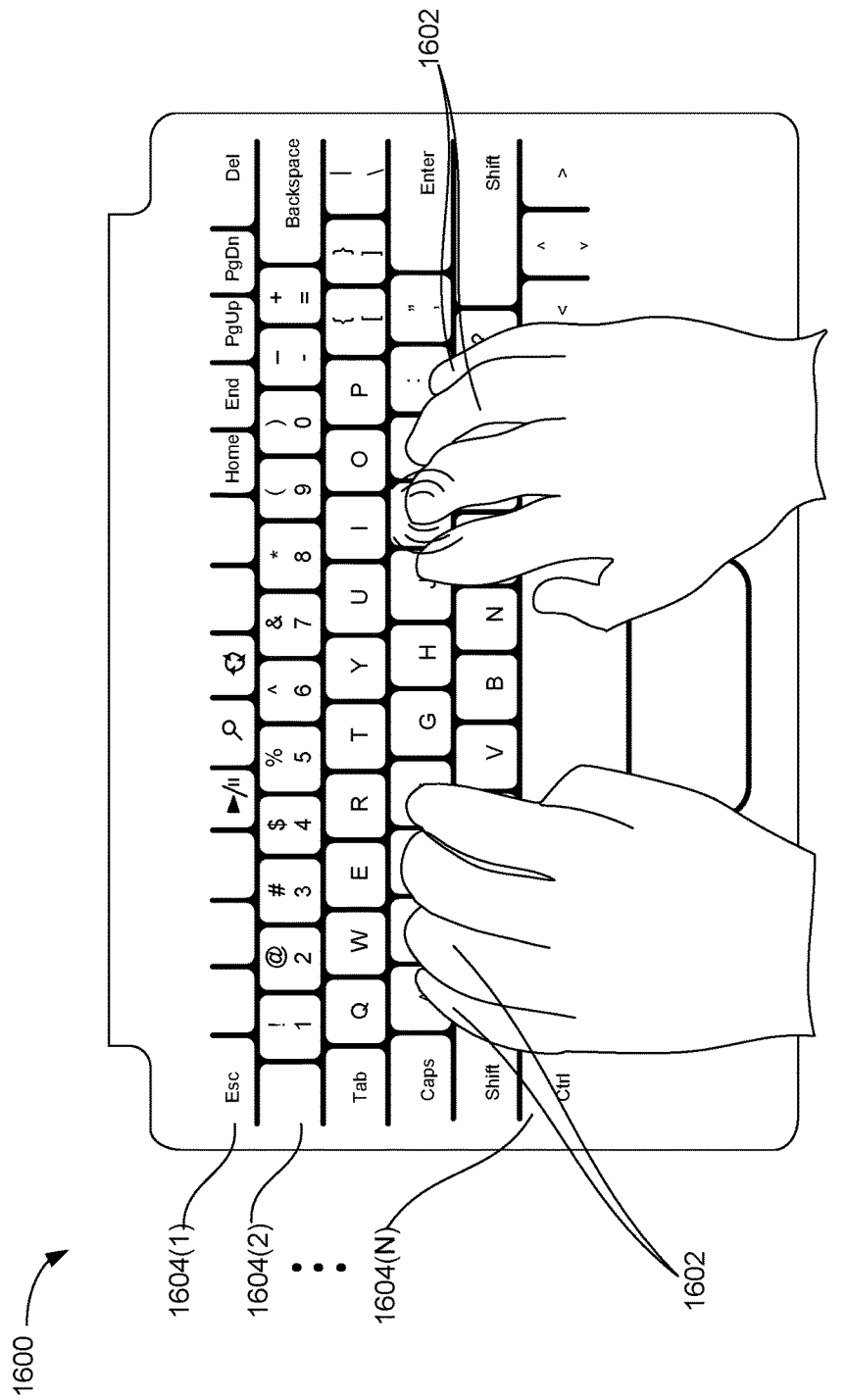
FIG. 16 illustrates localized haptic feedback provided on a keyboard implementing the haptic feedback assembly.

FIG. 16 illustrates an example keyboard 1600 including examples of one or more of the actuator switches of the embodiments disclosed herein. The keyboard 1600 is an example of a keyboard that can be used with a computer system, such the keyboard 302 of FIG. 3. A user, such as a typist, may rest his/her fingers 1602 on the keyboard 1600, such as when his/her fingers 1602 are in a home position familiar to trained typists for use in eyes-free typing. A key-press event may not be registered until a pressure on the top of a key 1604(1)-(N) meets or exceeds a minimum threshold pressure and is detected by a key-press sensing mechanism. Upon detecting or registering a key-press at a given key 1604(1)-(N), a piezo actuator, such as the piezo actuator 102 of FIG. 1, may produce a tactile or haptic response to the key-press event. As described above with reference to the previous figures, this response may be localized to the specific key that was pressed upon such that the other fingers 1602 that are resting on the keyboard 1600 do not feel a tactile sensation. That is, only the finger that pressed the key 1604 may feel the tactile sensation caused by the force-producing mechanism. FIG. 6 shows that one of the fingers 600 of the user's right hand feels the haptic feedback after pressing upon that key (e.g., the "K" key) which registered a key-press. It is to be appreciated that the user may press upon multiple keys 102(1)-(N) (e.g., SHIFT and "K") simultaneously, or at the same time in sequence, which will cause respective haptic feedback to be felt by both fingers 1602 that pressed the multiple keys.

Example Method

Figure 17:
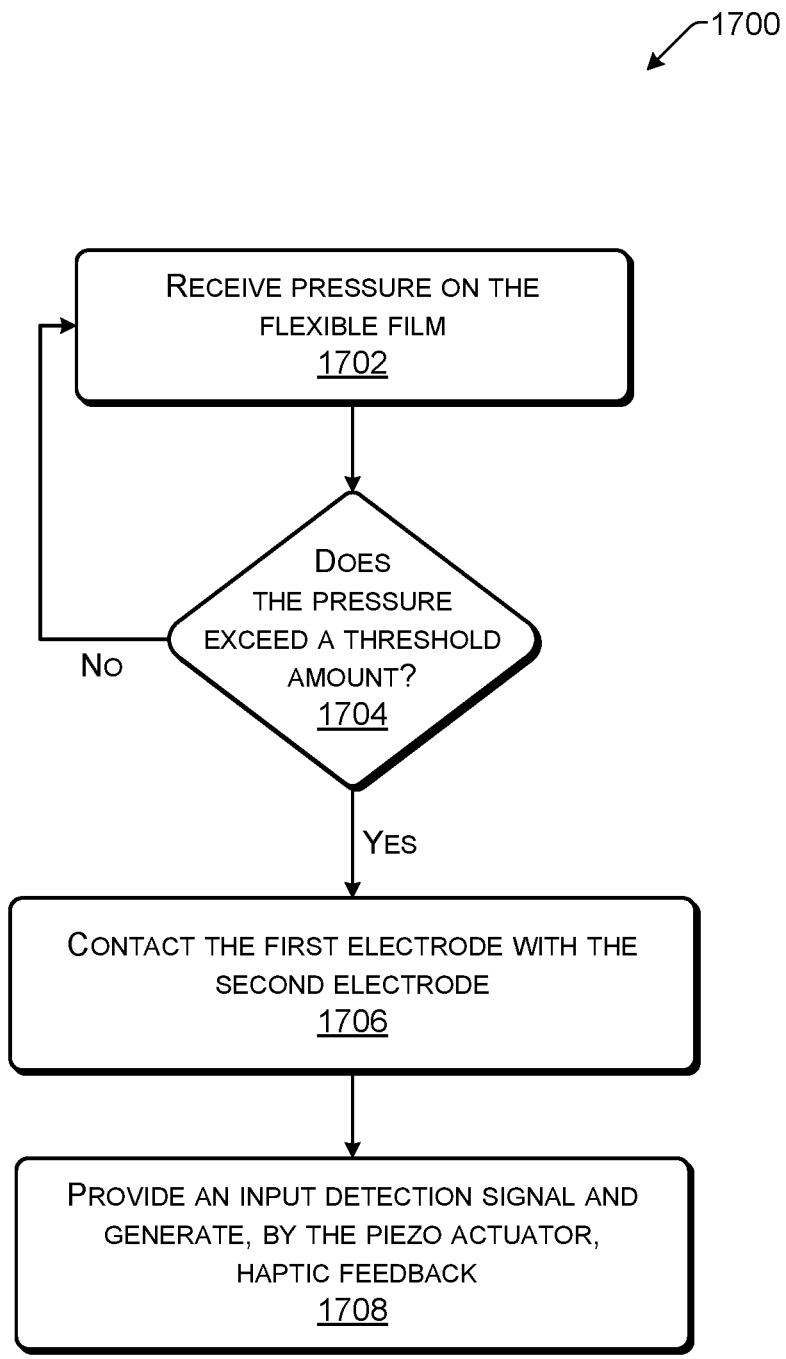
FIG. 17 is a flow diagram of an example process of providing haptic feedback according to some implementations.

FIG. 17 is a flow diagram of an example process 1700 of providing haptic feedback according to some implementations. The steps are performed by an actuator switch, such as the actuator switch 100 of FIG. 1. In some examples, one or more of the steps are performed by one or more keys of a keyboard or keypad, such as the keyboard 302. In some examples, the components that provide an actuation signal when a key is pressed are mechanical components, and therefore do not include control logic, such as logic devices and/or microcontrollers that detect which key/key switch is pressed in order to provide an actuation signal to a corresponding actuator.

At 1702, the surface of the flexible film 108 receives pressure. For example, a finger 204 applies pressure to the flexible film 108 above the film electrode 106. At 1704, if the pressure meets or exceeds a minimum threshold amount, then at 1706 a first electrode contacts a second electrode. For example, the film electrode 106 contacts the piezo electrode 104. At 404, if the pressure does not meet or exceed the minimum threshold amount, then the process returns to 1702. At 1708, the actuator switch 100 provides an input signal and generates, by a piezo actuator, haptic feedback. For example, the piezo actuator 104 deforms, causing haptic or tactile feedback for the finger 204.

The environment and individual elements described herein may of course include many other logical, programmatic, and physical components, of which those shown in the accompanying figures are merely examples that are related to the discussion herein.

Other architectures may be used to implement the described functionality, and are intended to be within the scope of this disclosure. Furthermore, although specific distributions of responsibilities are defined above for purposes of discussion, the various functions and responsibilities might be distributed and divided in different ways, depending on circumstances.

CONCLUSION

In closing, although the various embodiments have been described in language specific to structural features and/or methodological acts, it is to be understood that the subject matter defined in the appended representations is not necessarily limited to the specific features or acts described. Rather, the specific features and acts are disclosed as example forms of implementing the claimed subject matter.

The invention claimed is:

1. A method of making a keyboard comprising a plurality of keys beneath a flexible film, each of the plurality of keys made by the method comprising:
   providing the flexible film;
   providing a first electrode underneath the flexible film, the first electrode coupled to a voltage signal source;
   providing a row electrode adjacent to the first electrode and underneath the flexible film;
   providing a column electrode adjacent to the first electrode and underneath the flexible film;
   providing a second electrode located beneath the first electrode, the second electrode coupled to an input detector;
   providing an encoder electrode adjacent the second electrode, underneath the row electrode, the column electrode, and the flexible film, and not underneath the first electrode;
   providing a spacer configured to maintain at least a first threshold distance between the first electrode and the second electrode, between the row electrode and the encoder electrode, and between the column electrode and the encoder electrode, the first threshold distance is maintained when there is less than a first threshold amount of touch pressure applied to a top surface of the flexible film above the first electrode;
   providing a piezoelectric actuator beneath the second electrode and the encoder electrode, a top surface of the piezoelectric actuator coupled to the second electrode and the encoder electrode, wherein contact between the first electrode and the second electrode couples the voltage signal source to the input detector and the piezoelectric actuator, and wherein, when there is greater than or equal to the first threshold amount of touch pressure applied to the top surface of the flexible film above the first electrode, the piezoelectric actuator is configured to deform in response to contact between the first electrode and the second electrode; and
   providing a base plane beneath the piezoelectric actuator, the base plane coupled to a bottom surface of the piezoelectric actuator and a signal ground.

2. The method of claim 1, wherein the flexible film is configured to cause the first electrode to contact the second electrode in response to at least a second threshold amount of touch pressure applied to the top surface of the flexible film above the first electrode.

3. The method of claim 1, wherein the piezoelectric actuator is configured to provide haptic feedback in response to the first electrode contacting the second electrode.

4. The method of claim 1, further comprising:
providing an encoder connected to the row electrode and the column electrode, wherein the encoder being configured to detect when at least the first threshold amount of touch pressure applied to the top surface of the flexible film above the row electrode and the column electrode to cause a circuit to close between a row signal input and a column signal input of the encoder.

5. The method of claim 1, wherein the encoder electrode is ring-shaped and surrounds the second electrode.

6. A method of making an electronic device, the method of making the electronic device comprising:
providing a flexible film;
providing a first electrode underneath the flexible film, the first electrode coupled to a voltage signal source;
providing a row electrode adjacent to the first electrode and underneath the flexible film;
providing a column electrode adjacent to the first electrode and underneath the flexible film;
providing a second electrode located beneath the first electrode, the second electrode coupled to an input detector;
providing an encoder electrode adjacent the second electrode, underneath the row electrode, the column electrode, and the flexible film, and not underneath the first electrode;
providing a spacer configured to maintain at least a first threshold distance between the first electrode and the second electrode, between the row electrode and the encoder electrode, and between the column the electrode and encoder electrode, the first threshold distance is maintained when there is less than a first threshold amount of touch pressure applied to a top surface of the flexible film above the first electrode;
providing a piezoelectric actuator beneath the second electrode and the encoder electrode, a top surface of the piezoelectric actuator coupled to the second electrode, wherein contact between the first electrode and the second electrode couples the voltage signal source to the input detector and the piezoelectric actuator, and wherein, when there is greater than or equal to the first threshold amount of touch pressure applied to the top surface of the flexible film above the first electrode, the piezoelectric actuator is configured to deform in response to contact between the first electrode and the second electrode; and
providing a base plane beneath the piezoelectric actuator, the base plane coupled to a bottom surface of the piezoelectric actuator and a signal ground.

7. The method of claim 6, wherein the piezoelectric actuator is configured to provide tactile feedback in response to at least a second threshold amount of touch pressure applied to the flexible film.

8. The method of claim 6, further comprising:
providing an encoder connected to the row electrode and the column electrode, wherein the encoder being configured to detect when at least the first threshold amount of touch pressure applied to the top surface of the flexible film above the row electrode and the column electrode to cause a circuit to close between a row signal input and a column signal input of the encoder.

9. The method of claim 6, wherein the encoder electrode is ring-shaped and surrounds the second electrode.

* * * * *